(12) United States Patent
Yamamoto et al.

(10) Patent No.: US 11,870,404 B2
(45) Date of Patent: Jan. 9, 2024

(54) GAIN STABILIZATION

(71) Applicant: Qualcomm Incorporated, San Diego, CA (US)

(72) Inventors: Kentaro Yamamoto, San Diego, CA (US); Aram Akhavan, San Diego, CA (US); Ganesh Kiran, San Diego, CA (US); Lei Sun, San Diego, CA (US); Elias Dagher, Laguna Niguel, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 288 days.

(21) Appl. No.: 17/320,077

(22) Filed: May 13, 2021

(65) Prior Publication Data

US 2022/0368299 A1    Nov. 17, 2022

(51) Int. Cl.
| | | |
|---|---|---|
| *H03G 3/10* | (2006.01) | |
| *H03G 3/30* | (2006.01) | |
| *H03F 3/19* | (2006.01) | |
| *H03F 3/21* | (2006.01) | |
| *H03M 1/12* | (2006.01) | |

(52) U.S. Cl.
CPC ............ *H03G 3/3036* (2013.01); *H03F 3/19* (2013.01); *H03F 3/21* (2013.01); *H03M 1/124* (2013.01); *H03F 2200/453* (2013.01)

(58) Field of Classification Search
CPC ...... H03G 3/3036; H03G 3/30; H03G 3/3042; H03G 3/001; H03G 1/0088; H03G 1/0023; H03F 3/19; H03F 3/21; H03F 2200/453; H03F 3/72; H03F 2200/351; H03F 2200/447; H03F 2203/45024; H03F 2203/45052; H03F 2203/45302; H03F 1/223; H03F 1/303; H03F 3/45188; H03F 1/301; H03M 1/124; H03M 1/16
USPC .................................................. 330/278, 279
See application file for complete search history.

(56) References Cited

U.S. PATENT DOCUMENTS

| | | | |
|---|---|---|---|
| 9,584,085 B2 * | 2/2017 | Scott ......................... | H03F 1/32 |
| 9,819,314 B1 * | 11/2017 | Chiu .................. | H03F 3/45188 |
| 10,184,973 B2 * | 1/2019 | Nobbe .................... | H03F 1/565 |

(Continued)

FOREIGN PATENT DOCUMENTS

EP          1415392 B1      1/2007

OTHER PUBLICATIONS

International Search Report and Written Opinion—PCT/US2022/071243—ISA/EPO—dated Oct. 14, 2022, 23 pages.

(Continued)

*Primary Examiner* — Khanh V Nguyen
(74) *Attorney, Agent, or Firm* — Colby Nipper

(57) ABSTRACT

An apparatus is disclosed for gain stabilization. In an example aspect, the apparatus includes an amplifier and a gain-stabilization circuit. The amplifier has a gain that is based on a bias voltage and an amplification control signal. The gain-stabilization circuit is coupled to the amplifier and includes a replica amplifier. The replica amplifier has a replica gain that is based on the bias voltage and the amplification control signal. The gain-stabilization circuit is configured to adjust at least one of the bias voltage or the amplification control signal based on a gain error associated with the replica amplifier.

30 Claims, 13 Drawing Sheets

(56) References Cited

U.S. PATENT DOCUMENTS

2003/0030491 A1* 2/2003 Hart .................... H03G 1/0088
330/254
2019/0296756 A1* 9/2019 Ali ......................... H03F 1/301

OTHER PUBLICATIONS

Partial International Search Report—PCT/US2022/071243—ISA/EPO—dated Jul. 12, 2022, 16 pages.
Huang, et al., "A Non-Interleaved 12-b 330-MS/s Pipelined-SAR ADC With PVT-Stabilized Dynamic Amplifier Achieving Sub-1-dB SNDR Variation", Dec. 2017, pp. 3235-3247, 13 pages.
Park, et al., "An 11-b 100-MS/s Fully Dynamic Pipelined ADC Using a High-Linearity Dynamic Amplifier", Sep. 2020, pp. 2468-2477, 10 pages.
Verbruggen, et al., "A 2.1 mW 11b 410 MS/s Dynamic Pipelined SAR ADC with Background Calibration in 28nm Digital CMOS", Jan. 2013, 2 pages.

* cited by examiner

GAIN STABILIZATION

TECHNICAL FIELD

This disclosure relates generally to amplifiers and, more specifically, to stabilizing gain of an amplifier.

BACKGROUND

Electronic devices use radio-frequency (RF) signals to communicate information. These radio-frequency signals enable users to talk with friends, download information, share pictures, remotely control household devices, receive global positioning information, and so forth. These radio-frequency signals are analog signals, which can physically travel between electronic devices and transfer digitally encoded communication data. An electronic device can use an analog-to-digital converter to convert an analog signal to a digital signal, which enables the communication data to be extracted. It can be challenging, however, to design an analog-to-digital converter that can provide a sufficient sampling rate and resolution for some applications. In particular, some analog-to-digital converters use amplifiers that are susceptible to process, voltage, and temperature variations. Without the ability to control the gain of the amplifier across these variations, the performance of the analog-to-digital converter can be negatively impacted.

SUMMARY

An apparatus is disclosed that implements gain stabilization. In example implementations, the apparatus includes a gain-stabilization circuit and an amplifier. The gain-stabilization circuit implements a closed-loop feedback system that substantially stabilizes a gain of the amplifier and compensates for variations in process, voltage (e.g., supply voltage), or temperature (e.g., PVT variations). In particular, the gain-stabilization circuit adjusts a bias voltage and/or an amplification control signal based on a gain error associated with the amplifier. In various implementations, the gain-stabilization circuit can determine the gain error "indirectly" using a replica amplifier, "directly" by time-sharing the amplifier for calibration, or some combination thereof. By providing gain stabilization, the amplifier can be utilized in a wide variety of applications, including pipeline analog-to-digital converters.

In an example aspect, an apparatus is disclosed. The apparatus includes an amplifier and a gain-stabilization circuit. The amplifier has a gain that is based on a bias voltage and an amplification control signal. The gain-stabilization circuit is coupled to the amplifier and includes a replica amplifier. The replica amplifier is configured to have a replica gain that is based on the bias voltage and the amplification control signal. The gain-stabilization circuit is configured to adjust at least one of the bias voltage or the amplification control signal based on a gain error associated with the replica amplifier.

In an example aspect, an apparatus is disclosed. The apparatus includes amplification means for providing a gain that is based on a bias voltage and an amplification control signal. The apparatus also includes gain-stabilization means for substantially stabilizing the gain of the amplification means. The gain-stabilization means includes replication means for providing a replica gain that is based on the bias voltage and the amplification control signal. The gain-stabilization means also includes means for adjusting at least one of the bias voltage or the amplification control signal based on a gain error associated with the replication means.

In an example aspect, a method for gain stabilization is disclosed. The method includes amplifying an input signal using an amplifier having a gain based on a bias voltage and an amplification control signal. The method also includes amplifying a calibration input voltage using a replica amplifier having a replica gain that is based on the bias voltage and the amplification control signal. The method additionally includes adjusting at least one of the bias voltage or the amplification control signal based on a gain error associated with the replica amplifier.

In an example aspect, an apparatus is disclosed. The apparatus includes an amplifier and a gain-stabilization circuit. The amplifier has a gain that is based on a bias voltage and an amplification control signal. The gain-stabilization circuit is coupled to the amplifier and includes a gain-error correction circuit and switching circuitry. The switching circuitry is configured to selectively provide an input signal to an input of the amplifier; or provide a calibration input voltage to the input of the amplifier and connect an output of the amplifier to the gain-error correction circuit. The gain-error correction circuit is configured to determine a gain error associated with the amplifier based on the switching circuitry connecting the output of the amplifier to the gain-error correction circuit. The gain-stabilization circuit is configured to adjust at least one of the bias voltage or the amplification control signal based on the gain error.

BRIEF DESCRIPTION OF DRAWINGS

FIG. 4-1 illustrates an example amplification circuit and an example dynamic amplifier for gain stabilization.

FIG. 4-2 illustrates an example differential amplifier for gain stabilization.

DETAILED DESCRIPTION

An electronic device uses an analog-to-digital converter to convert an analog signal to a digital signal. In particular, the analog-to-digital converter samples and quantizes segments of the analog signal into discrete voltage levels. The analog-to-digital converter generates the digital signal based on these discrete voltage levels. It can be challenging, however, to design an analog-to-digital converter that can provide a sufficient sampling rate and resolution for some applications, such as millimeter-wave (mmW) wireless communications, imaging, digital video, and Ethernet.

There are a variety of different types of analog-to-digital converters. A pipeline analog-to-digital converter, for example, represents one type of analog-to-digital converter that can be used for high-speed applications. The pipeline analog-to-digital converter includes multiple stages, which are connected together in series. Each conversion stage determines one or more bits of a digital output signal and passes a remainder, or residue, to the next stage for processing. Between each conversion stage is an amplifier, which amplifies the residue for the next conversion stage.

Some pipeline analog-to-digital converters use dynamic amplifiers to amplify the residue. Dynamic amplifiers can exhibit a faster response while introducing less noise and consuming less power than other types of amplifiers, such as an operational amplifier. However, the gain of a dynamic amplifier can be susceptible to process, voltage, and temperature variations. Without the ability to control the gain of the dynamic amplifier, the performance of the analog-to-digital converter can be negatively impacted.

To address this challenge, techniques for gain stabilization are described. In example implementations, the gain-stabilization circuit implements a closed-loop feedback system that substantially stabilizes a gain of the amplifier and compensates for variations in process, voltage (e.g., supply voltage), or temperature (e.g., PVT variations). In particular, the gain-stabilization circuit adjusts a bias voltage and/or an amplification control signal based on a gain error associated with the amplifier. In various implementations, the gain-stabilization circuit can determine the gain error "indirectly" using a replica amplifier, "directly" by time-sharing the amplifier for calibration, or some combination thereof. By providing gain stabilization, the amplifier can be utilized in a wide variety of applications, including pipeline analog-to-digital converters.

Figure 1:
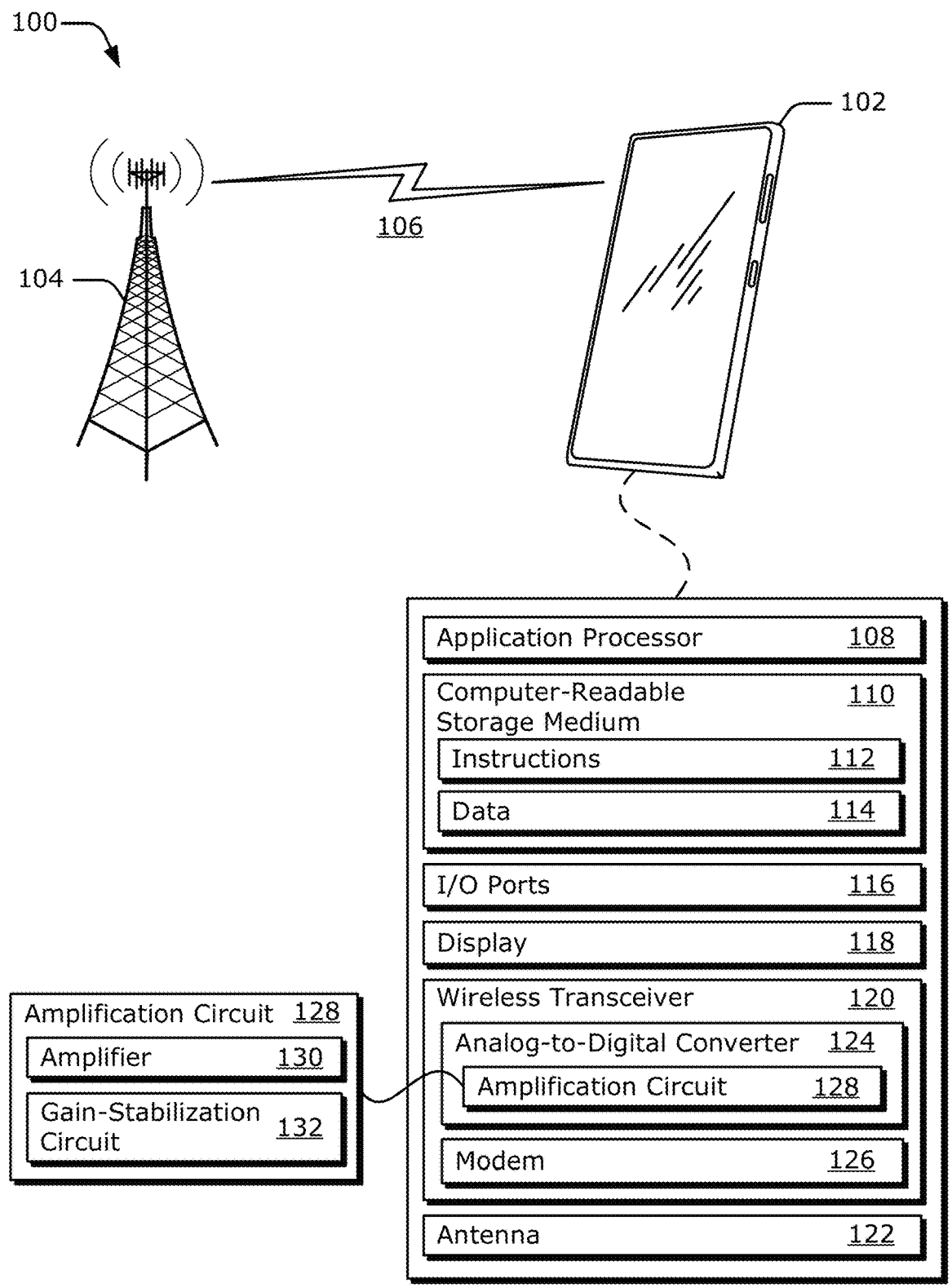
FIG. 1 illustrates an example operating environment for gain stabilization.

FIG. 1 illustrates an example environment 100 for utilizing gain stabilization. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, a fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. Alternatively or additionally, the computing device 102 can include a wired transceiver, such as an Ethernet or fiber optic interface for communicating over a local network, intranet, or the Internet. The wireless transceiver 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

The wireless transceiver 120 includes at least one analog-to-digital converter 124 and at least one modem 126. The analog-to-digital converter 124 converts analog signals that are received and processed by the wireless transceiver 120 to digital signals. The modem 126 can further process the digital signals provided by the analog-to-digital converter 124, as described below.

The analog-to-digital converter 124 can be implemented, for example, as a pipeline analog-to-digital converter, which includes at least one amplification circuit 128 for amplifying a residue signal. The amplification circuit 128 includes at least one amplifier 130 and at least one gain-stabilization circuit 132. The amplifier 130 can be implemented as, for instance, a dynamic amplifier. In general, the amplifier 130 provides amplification to support some type of operation performed by the computing device 102. In this example, the amplifier 130 provides amplification for analog-to-digital conversion. The amplifier 130 can be implemented using at least one n-channel metal-oxide-semiconductor field-effect transistor (NMOSFET) or p-channel metal-oxide-semiconductor field-effect transistor (PMOSFET). Although described with respect to a pipeline analog-to-digital converter, the amplifier 130 can be used in a variety of other types of circuits, including other types of analog-to-digital converters, other types of amplification circuits, and so forth.

By itself, the amplifier 130 may have a gain that changes or fluctuates due to process, voltage, or temperature variations. The gain-stabilization circuit 132, however, substantially stabilizes the gain of the amplifier 130 across these variations. In this way, the amplifier 130 can provide a relatively steady (e.g., constant) gain over various conditions, which improves the accuracy of the analog-to-digital converter 124 compared to other analog-to-digital converters that do not utilize gain stabilization.

The gain-stabilization circuit 132 can implement a closed-loop feedback system, which can "indirectly" or "directly" determine a gain error associated with the amplifier 130. With this closed-loop feedback design, the gain-stabilization circuit 132 can cause the gain of the amplifier 130 to approach a target gain faster and with less error compared to other open-loop techniques. The gain-stabilization circuit 132 implements, at least in part, gain stabilization for the amplifier 130 as described herein.

The computing device 102 can include multiple amplification circuits 128. In some implementations, the multiple amplification circuits 128 can each have individual gain-stabilization circuits 132. This can be beneficial in situations in which the amplifiers 130 across the multiple amplification circuits 128 vary in terms of size (e.g., channel width-channel length (W/L) ratios) and gain. In other implementations, at least a portion of the multiple amplification circuits 128 can share a same gain-stabilization circuit 132. This can be beneficial by saving space in situations in which the amplifiers 130 are relatively similar in terms of size and gain.

Although not explicitly shown, the modem 126 can include at least one processor and CRM, which stores computer-executable instructions (such as the application processor 108, the CRM 110, and the instructions 112). The processor and the CRM can be localized at one module or one integrated circuit chip or can be distributed across multiple modules or chips. Together, the processor and associated instructions can be realized in separate circuitry, fixed logic circuitry, hard-coded logic, and so forth. In some implementations, the modem 126 can include a portion of the CRM 110, can access the CRM 110 to obtain computer-readable instructions, or can include separate CRM. The modem 126 can be implemented as part of the wireless transceiver 120, the application processor 108, a communication processor, a general-purpose processor, some combination thereof, and so forth.

The modem 126 controls the wireless transceiver 120 and enables wireless communication to be performed. The modem 126 can include baseband circuitry to perform high-rate sampling processes that can include analog-to-digital conversion, digital-to-analog conversion, gain correction, skew correction, frequency translation, and so forth. The modem 126 can provide communication data for transmission and process a baseband signal to generate data, which can be provided to other parts of the computing device 102 for wireless communication. The wireless transceiver 120 is further described with respect to FIG. 2.

Figure 2:
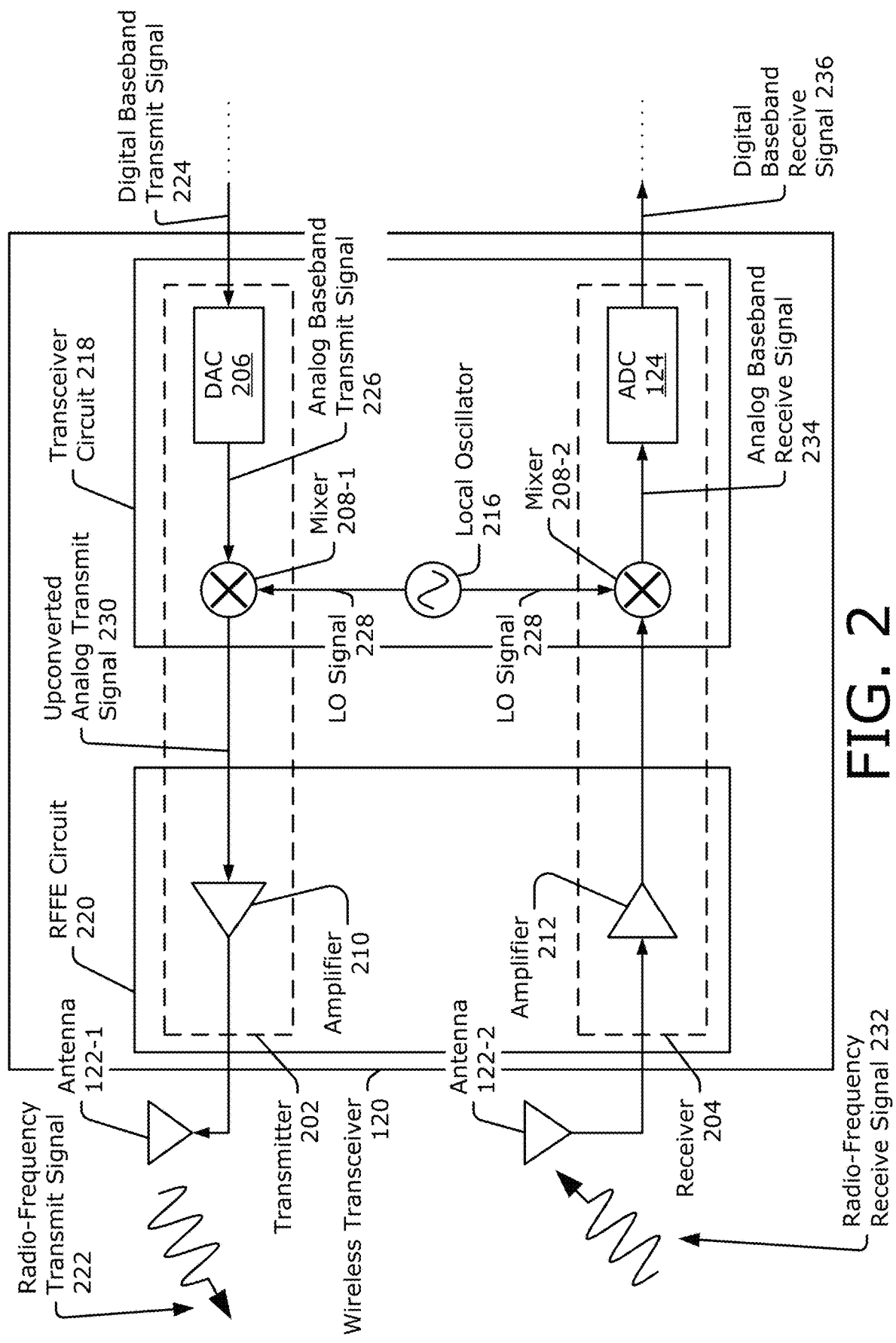
FIG. 2 illustrates an example wireless transceiver with an analog-to-digital converter that employs gain stabilization.

FIG. 2 illustrates an example wireless transceiver 120 with at least one analog-to-digital converter 124 (ADC 124) that employs gain stabilization. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be selectively connected to a same antenna through a switch (not shown). The transmitter 202 is shown to include at least one digital-to-analog converter 206 (DAC 206), at least one first mixer 208-1, and at least one amplifier 210 (e.g., a power amplifier). The receiver 204 includes at least one amplifier 212 (e.g., a low-noise amplifier), at least one second mixer 208-2, and the analog-to-digital converter 124. The first mixer 208-1 and the second mixer 208-2 are coupled to a local oscillator 216. Although not explicitly shown, the digital-to-analog converter 206 of the transmitter 202 and the analog-to-digital converter 124 of the receiver 204 can be coupled to the modem 126.

In some implementations, the wireless transceiver 120 is implemented using multiple circuits, such as a transceiver circuit 218 and a radio-frequency front-end (RFFE) circuit 220. As such, the components that form the transmitter 202 and the receiver 204 are distributed across these circuits. As shown in FIG. 2, the transceiver circuit 218 includes the digital-to-analog converter 206 of the transmitter 202, the mixer 208-1 of the transmitter 202, the mixer 208-2 of the receiver 204, and the analog-to-digital converter 124 of the receiver 204. In other implementations, the digital-to-analog converter 206 and the analog-to-digital converter 124 can be implemented on another separate circuit that includes the modem 126. The radio-frequency front-end circuit 220 includes the amplifier 210 of the transmitter 202 and the amplifier 212 of the receiver 204. Although not shown, the radio-frequency front-end circuit 220 can include other components, such as phase shifters and filters.

During transmission, the transmitter 202 generates a radio-frequency transmit signal 222 (e.g., a wireless signal or a wireless communication signal), which is transmitted using the antenna 122-1. To generate the radio-frequency transmit signal 222, the digital-to-analog converter 206 converts a digital baseband transmit signal 224 to an analog baseband transmit signal 226. The digital-to-analog converter 206 provides the analog baseband transmit signal 226 to the first mixer 208-1. The first mixer 208-1 upconverts the analog baseband transmit signal 226 using a local oscillator (LO) signal 228 provided by the local oscillator 216. The first mixer 208-1 generates an upconverted signal, which is referred to as an upconverted analog transmit signal 230. The upconverted analog transmit signal 230 can be a radio-frequency signal. The amplifier 210 amplifies the upconverted analog transmit signal 230 and passes the amplified upconverted analog transmit signal 230 to the antenna 122-1 for transmission. The transmitted signal is represented by the radio-frequency transmit signal 222.

During reception, the antenna 122-2 receives a radio-frequency receive signal 232 and passes the radio-frequency receive signal 232 to the receiver 204. The amplifier 212 of the receiver 204 amplifies the radio-frequency receive signal 232 and passes the amplified radio-frequency receive signal 232 to the second mixer 208-2. The second mixer 208-2 downconverts the amplified radio-frequency receive signal 232 using the local oscillator signal 228 to generate an analog baseband receive signal 234. The analog-to-digital converter 124 converts the analog baseband receive signal 234 into a digital baseband receive signal 236, which can be processed by the modem 126. In an example implementation the analog-to-digital converter 124 is as a pipeline analog-to-digital converter, which is further described with respect to FIG. 3.

Figure 3:
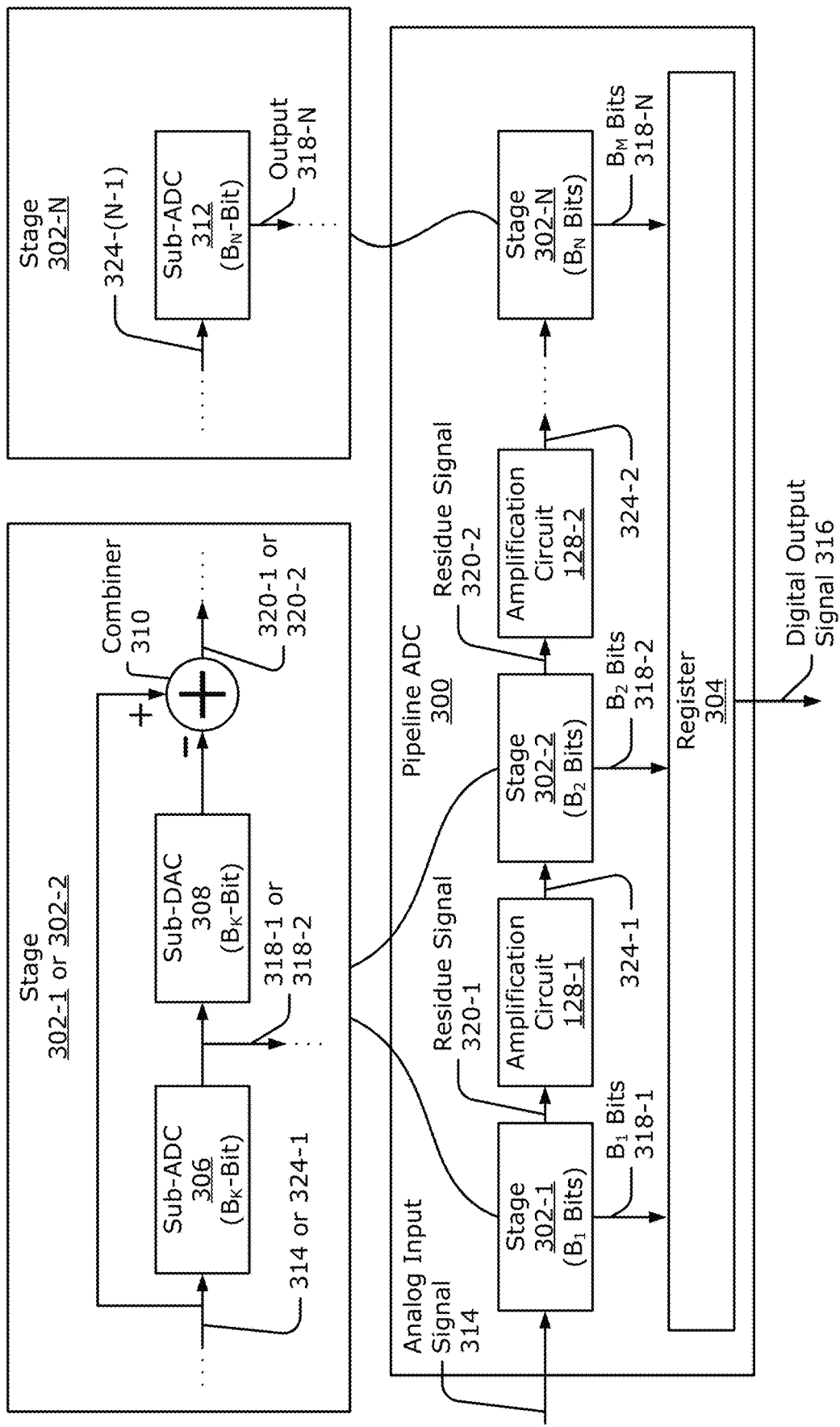
FIG. 3 illustrates an example pipeline analog-to-digital converter that employs gain stabilization.

FIG. 3 illustrates an example pipeline analog-to-digital converter 300 (pipeline ADC 300) that employs gain stabilization. The pipeline analog-to-digital converter 300 includes at least two stages 302 (e.g., conversion stages) and at least one amplification circuit 128. In the depicted configuration, the pipeline analog-to-digital converter 300 includes multiple stages 302-1, 302-2 . . . 302-N, where N represents a positive integer greater than one. The stage 302-1 represents a first (e.g., beginning) stage in the pipeline analog-to-digital converter 300. Where N equals at least three, the stage 302-2 represents an intermediate (e.g., middle) stage in the pipeline analog-to-digital converter 300. The stage 302-N represents a last (e.g., final) stage in the pipeline analog-to-digital converter 300.

The stages 302-1 to 302-N each perform a portion of the analog-to-digital conversion to resolve one or more bits of a digital signal. Each successive stage in the pipeline determines the next set of least significant bits (LSBs) of the digital signal. For example, the stage 302-1 determines a set of most significant bits (MSBs) associated with the digital signal, and the stage 302-N determines a last set of least significant bits associated with the digital signal. Each of the stages prior to the last stage (e.g., stages 302-1 and 302-2) also determines its quantization error (e.g., residue or remainder) and passes the residue to the next stage.

The stages 302-1 to 302-N operate in successive order on a single sample. For example, during a first time interval, the stage 302-1 can operate on a first sample of an input signal. During a second time interval, the stage 302-2 can operate on the first sample while the stage 302-1 can operate on a second sample. Therefore, at a given time interval, the stages 302-1 to 302-N can operate at least partly in parallel on different samples in a pipelined manner.

The pipeline analog-to-digital converter 300 also includes amplification circuits 128-1 and 128-2. The amplification circuits 128-1 and 128-2 are interlaced between the stages 302-1 to 302-N. For example, the amplification circuit 128-1 is coupled between the stage 302-1 and the stage 302-2. Also, the amplification circuit 128-2 is coupled between the stage 302-2 and the stage 302-N. In this manner, the stages 302-1 to 302-N and the amplification circuits 128-1 and 128-2 are cascaded together in series to form a pipeline. The amplification circuits 128-1 and 128-2 provide amplification to enable the pipeline analog-to-digital converter 300 to provide a target resolution (e.g., a particular quantity of digital bits).

The pipeline analog-to-digital converter 300 also includes a register 304, which is coupled to the stages 302-1 to 302-N. The register 304 combines the outputs from the stages 302-1 to 302-N to generate the digital signal. Because the sets of bits provided by each stage 302-1 to 302-N are determined during different time intervals, the register 304 can align the sets of bits associated with a same sample. Although not explicitly shown, the pipeline analog-to-digital converter 300 can also include sample-and-hold circuits, timing circuits, and other error correction circuitry.

The stages prior to the last stage (e.g., the stages 302-1 and 302-2) can each include at least one analog-to-digital converter 306 (e.g., a sub-analog-to-digital converter (sub-ADC 306)), at least one digital-to-analog converter 308 (e.g., a sub-digital-to-analog converter (sub-DAC 308)), and at least one combiner 310. In some implementations, the sub-ADC 306 and the sub-DAC 308 are implemented together using a successive-approximation digital-to-analog converter, which yields a residue signal at the end of each analog-to-digital conversion.

The sub-ADC 306 can be implemented by a variety of different types of analog-to-digital converters, including a flash analog-to-digital converter or a successive-approximation-register (SAR) analog-to-digital converter (SAR ADC). The sub-ADC 306 provides $B_K$ bits of resolution, where $B_K$ represents a positive integer and the subscript K represents the non-final stage. Thus, the variable $B_K$ can represent $B_1$, which is associated with the stage 302-1, or $B_2$, which is associated with the stage 302-2.

The sub-DAC 308 can be implemented by a variety of different types of digital-to-analog converters, including a switched-capacitor digital-to-analog converter (CDAC). The sub-DAC 308 has $B_K$ bits of resolution, which represents the quantity of different voltage levels the sub-DAC 308 can produce.

An input of the sub-ADC 306 is coupled to an input of the pipeline analog-to-digital converter 300 or a previous element in the pipeline analog-to-digital converter 300 (e.g., the amplification circuits 128-1 or 128-2). An output of the sub-ADC 306 is coupled to the register 304 and an input of the sub-DAC 308. Inputs of the combiner 310 are respectively coupled to the input of the sub-ADC 306 and an output of the sub-DAC 308. An output of the combiner 310 is coupled to the next element in the pipeline analog-to-digital converter 300 (e.g., the amplification circuit 128-1 or 128-2).

The last stage 302-N of the pipeline analog-to-digital converter 300 includes at least one sub-ADC 312, which can be similar to or different than the sub-ADC 306. An input of the sub-ADC 312 is coupled to the previous element in the pipeline analog-to-digital converter 300 (e.g., the amplification circuit 128-2 or another amplification circuit not explicitly shown). An output of the sub-ADC 312 is coupled to the register 304. The sub-ADC 312 provides $B_N$ bits of resolution, where $B_N$ represents a positive integer that is greater than or equal to one and the subscript N represents the final stage.

During operation, the pipeline analog-to-digital converter 300 accepts an analog input signal 314 (e.g., the analog baseband receive signal 234 of FIG. 2) and generates a digital output signal 316 (e.g., the digital baseband receive signal 236). In particular, the pipeline analog-to-digital converter 300 captures a first voltage of the analog input signal 314 and holds this voltage to enable the stage 302-1 to determine $B_1$ bits 318-1 of the digital output signal 316. Holding this voltage also enables the stage 302-2 to determine $B_2$ bits 318-2 of the digital output signal 316 and the stage 302-N to determine $B_N$ bits 318-N of the digital output signal 316. The variables $B_1$, $B_2$, and $B_N$ can represent a same integer, different integers, or some combination thereof.

At a first time interval, the sub-ADC 306 of the stage 302-1 processes the analog input signal 314 to generate the $B_1$ bits 318-1. The sub-DAC 308 of the stage 302-1 converts the $B_1$ bits 318-1 to an analog signal. The combiner 310 of the stage 302-1 compares the analog input signal 314 to the analog representation of the $B_1$ bits 318-1 to generate a residue signal 320-1, which represents the quantization error of the sub-ADC 306 of the stage 302-1. In an example implementation, the combiner 310 subtracts the analog representation of the $B_1$ bits 318-1 from the analog input signal 314. The stage 302-1 passes the residue signal 320-1 to the amplification circuit 128-1. The amplification circuit 128-1 amplifies the residue signal 320-1 by an amount (e.g., by a predetermined amount) to generate an amplified residue signal 324-1.

The stage 302-2 and the amplification circuit 128-2 perform similar operations as described above with respect to the stage 302-1 and the amplification circuit 128-1. For example, at a second time interval, the sub-ADC 306 of the stage 302-2 processes the amplified residue signal 324-1 to generate the $B_2$ bits 318-2. The sub-DAC 308 of the stage 302-2 converts the $B_2$ bits 318-1 to an analog signal. The combiner 310 of the stage 302-2 compares the amplified residue signal 324-1 to the analog representation of the $B_2$ bits 318-2 to generate a residue signal 320-2, which represents the quantization error of the sub-ADC 306 of the stage 302-2. The stage 302-2 passes the residue signal 320-2 to the amplification circuit 128-2. The amplification circuit 128-2 amplifies the residue signal 320-2 to generate an amplified residue signal 324-2.

This process continues for subsequent stages and subsequent time intervals. At an Nth time interval, the sub-ADC 312 of the stage 302-N processes an amplified residue signal 324-(N−1) generated by a previous stage within the pipeline analog-to-digital converter 300. In some implementations, the amplified residue signal 324-(N−1) represents the amplified residue signal 324-2. The sub-ADC 312 generates the $B_N$ bits 318-N based on the amplified residue signal 324-(N−1).

The register 304 combines the $B_1$, $B_2$, and $B_N$ bits 318-1 to 318-N to generate the digital output signal 316. The register 304 can provide the digital output signal 316 to the modem 126. To improve the accuracy of the pipeline analog-to-digital converter 300, the amplification circuits 128-1 and 128-2 can use gain stabilization to ensure that the amplification of the residue signals 320-1 and 320-2 are stable across variations in process, voltage, and temperature. An example amplification circuit 128 is further described with respect to FIG. 4-1.

Figures 1, 4:
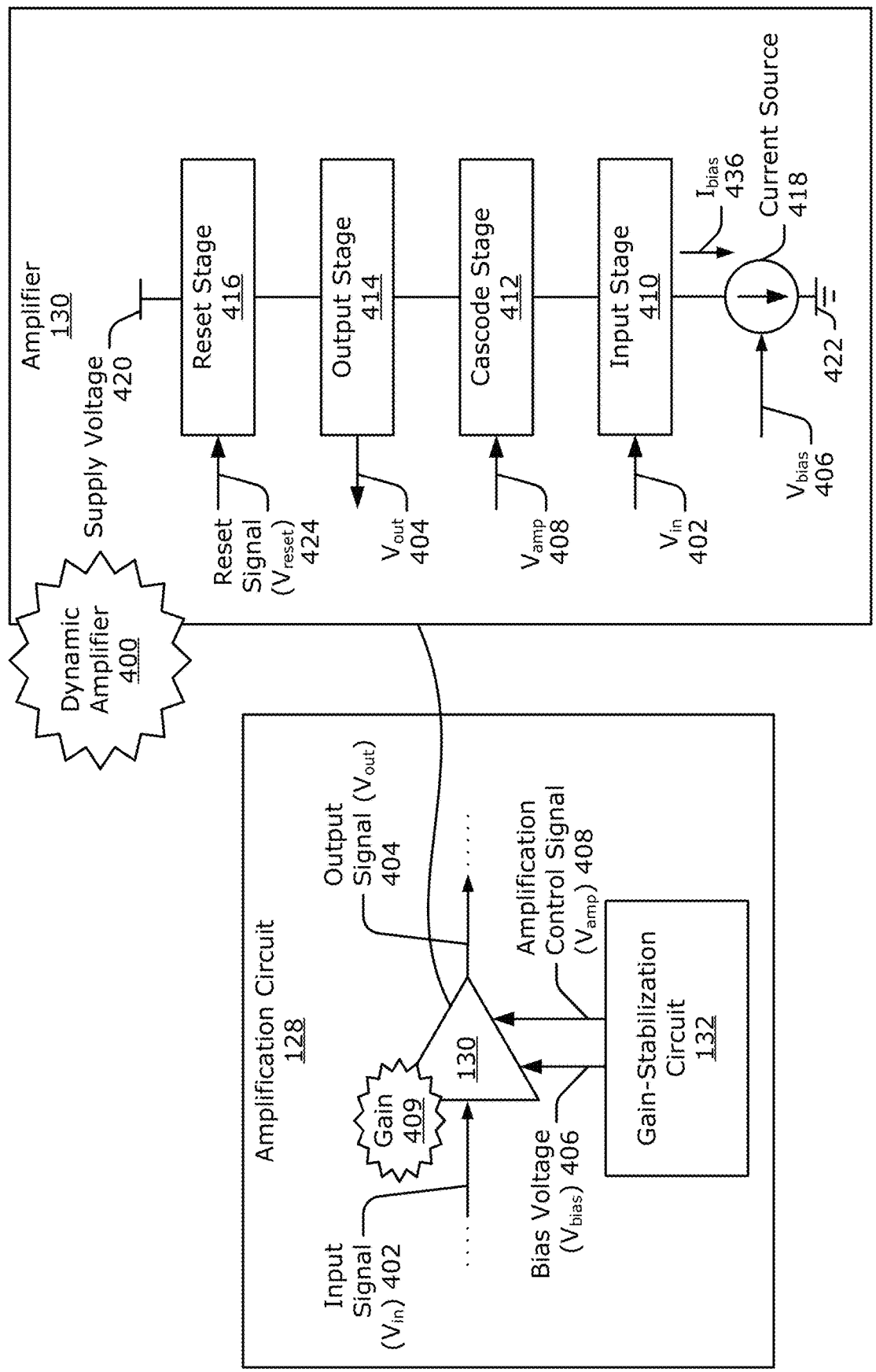
Figures 2, 4:
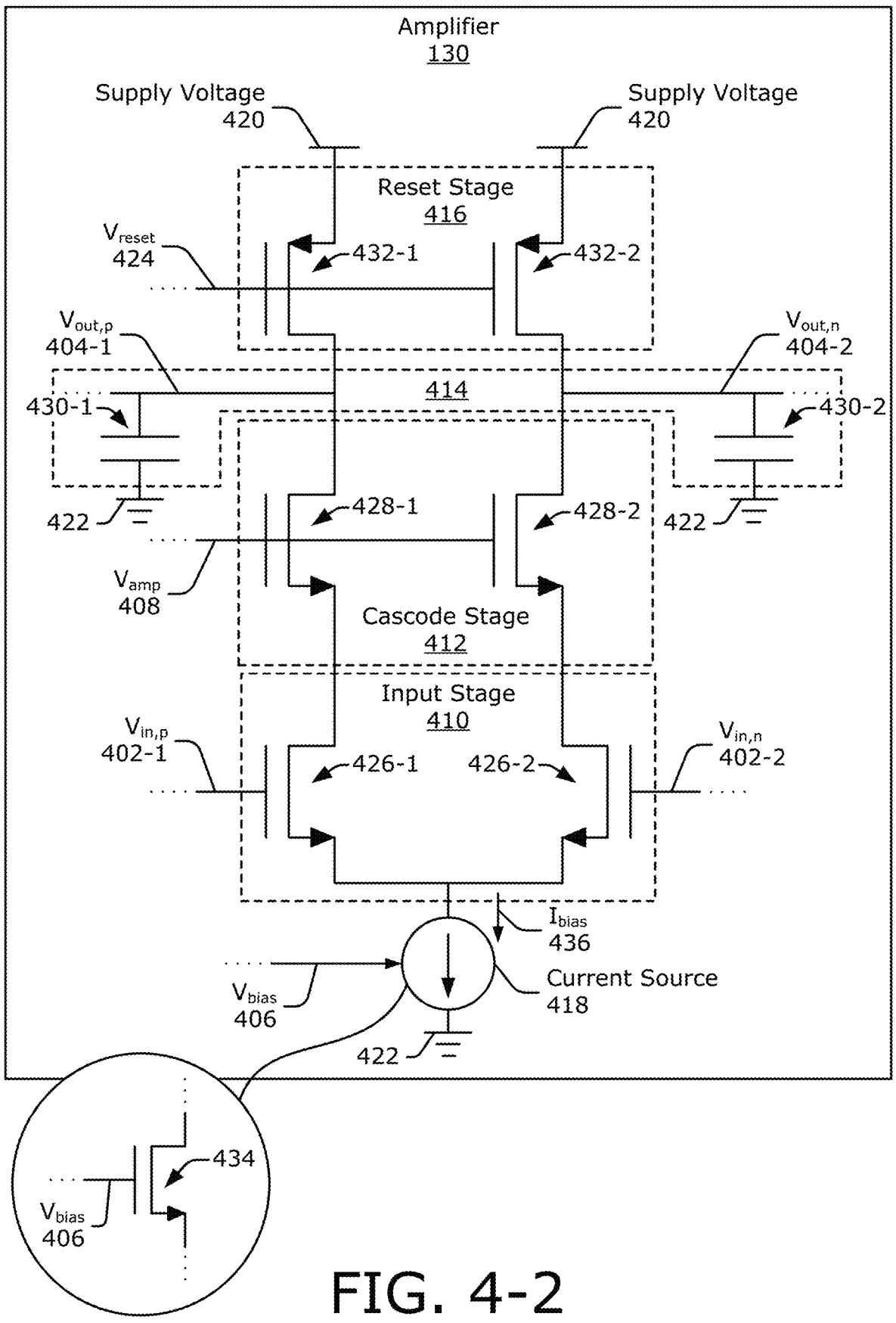

FIG. 4-1 illustrates an example amplification circuit 128 and an example dynamic amplifier 400 for gain stabilization. The amplification circuit 128 includes the amplifier 130 and the gain-stabilization circuit 132. During operation, the amplifier 130 accepts an input signal 402, which includes an input voltage $V_{in}$. The amplifier 130 generates an output signal 404, which includes an output voltage $V_{out}$ and represents an amplified version of the input signal 402. The gain-stabilization circuit 132 generates a bias voltage 406 ($V_{bias}$ 406) and an amplification control signal 408, which can include a voltage $V_{amp}$, to stabilize a gain 409 of the amplifier 130.

In an example implementation, the amplifier 130 is implemented as a dynamic amplifier 400, which has an architecture depicted on the right of FIG. 4-1. In the depicted configuration, the amplifier 130 includes an input stage 410, a cascode stage 412, an output stage 414, and a reset stage 416. The input stage 410 is coupled to an input of the amplification circuit 128 and the cascode stage 412. The cascode stage 412 is coupled to the gain-stabilization circuit 132, the input stage 410, and the output stage 414. The output stage 414 is coupled to an output of the amplification circuit 128, the cascode stage 412, and the reset stage 416. The reset stage 416 is coupled to the output stage 414 and a supply voltage 420 (e.g., coupled to a supply voltage node that accepts a supply voltage). The current source 418 is coupled to the gain-stabilization circuit 132, the input stage 410, and a ground 422.

The input stage 410 can be implemented using at least one input transistor, such as an n-channel metal-oxide-semiconductor field-effect transistor (MOSFET) that is configured as a common-source amplifier. The input stage 410 accepts the input signal 402 from another circuit, such as a previous stage 302 within the pipeline analog-to-digital converter 300.

The cascode stage 412 can be implemented using, for example, at least one transistor. The transistor can be another n-channel MOSFET that is configured as a common-gate amplifier. In some implementations, the cascode stage 412 includes multiple n-channel MOSFETs connected in series between the input stage 410 and the output stage 414. The cascode stage 412 is biased by (e.g., activated or deactivated by) the amplification control signal 408.

The output stage 414 can include at least one capacitor. The output stage 414 provides the output signal 404 to another circuit, such as a next stage 302 within the pipeline analog-to-digital converter 300.

The reset stage 416 can include at least one transistor, such as a p-channel MOSFET. In general, the reset stage 416 is biased by (e.g., activated or deactivated by) a reset signal 424, which can include a voltage $V_{reset}$. The reset signal 424 can be generated by the gain-stabilization circuit 132 or another circuit within the computing device 102.

The current source 418 can be implemented by at least one transistor, such as an additional n-channel MOSFET. The current source 418 accepts the bias voltage 406 and pulls (e.g., draws or absorbs) a current based on the bias voltage 406. In general, the current source 418 pulls a larger amount of current for higher bias voltages 406 and a smaller amount of current for lower bias voltages 406.

During a reset phase of operation, the amplifier 130 charges the capacitor of the output stage 414 to the supply voltage 420. In particular, the reset signal 424 activates the reset stage 416 to connect the output stage 414 to the supply voltage 420. Additionally, the amplification control signal 408 disables the cascode stage 412 to isolate the output stage 414 from the input stage 410.

During an amplification phase of operation, the input stage 410 accepts the input signal 402, the reset signal 424 deactivates the reset stage 416 to isolate the output stage 414 from the supply voltage 420, and the current source 418 pulls the current based on the bias voltage 406. Additionally, the amplification control signal 408 activates the cascode stage 412 to connect the input stage 410 to the output stage 414. In general, a duration of the amplification phase is determined by a pulsewidth of the amplification control signal 408. Together, the input stage 410 and the cascode stage 412 discharge the capacitor of the output stage 414. The rate at which the output stage 414 discharges is dependent upon the transconductance ($g_m$) of the amplifier 130. The transconductance of the amplifier 130 is based on the bias voltage 406, which controls the amount of current pulled by the current source 418.

During the amplification phase, the gain 409 of the amplifier 130 is based on (e.g., dependent upon) the bias voltage 406 and the amplification control signal 408. In particular, the gain 409 is proportional to the transconductance and the pulsewidth of the amplification control signal, as further described by Equation 1:

$$A = \frac{g_m \cdot T_{amp}}{C} \quad \text{Equation 1}$$

wherein A represents the gain 409 of the amplifier 130, $g_m$ represents the transconductance of the amplifier 130, $T_{amp}$ represents the pulsewidth of the amplification control signal 408, and C represents a capacitance of the capacitor within the output stage 414. The transconductance, the pulsewidth of the amplification control signal 408, and the capacitance can vary independently over variations in process, voltage, and/or temperature. Consequently, it can be challenging to stabilize the gain 409 of the amplifier 130.

The gain-stabilization circuit 132, however, implements a closed-loop feedback system that can dynamically adjust the bias voltage 406 and/or the amplification control signal 408 to stabilize the gain 409 of the amplifier 130. For example, the gain-stabilization circuit 132 can increase the bias voltage 406 and/or increase the pulsewidth of the amplification control signal 408 to increase the gain 409 of the amplifier 130. Also, the gain-stabilization circuit 132 can decrease the bias voltage 406 and/or decrease the pulsewidth of the amplification control signal 408 to decrease the gain 409 of the amplifier 130. In this way, the gain-stabilization circuit 132 can cause the gain 409 of the amplifier 130 to approach a target gain (e.g., a desired gain). An example differential implementation of the dynamic amplifier 400 is further described with respect to FIG. 4-2.

FIG. 4-2 illustrates an example differential implementation of the amplifier 130 (e.g., the dynamic amplifier 400). In the depicted configuration, the input stage 410 includes input transistors 426-1 and 426-2, which are implemented as n-channel MOSFETs. Gate terminals of the input transistors 426-1 and 426-2 are coupled to the input of the amplification circuit 128 and respectively accept differential voltages 402-1 and 402-2 associated with the input signal 402. Source terminals of the input transistors 426-1 and 426-2 are coupled to the current source 418. Drain terminals of the input transistors 426-1 and 426-2 are coupled to the cascode stage 412.

The cascode stage 412 includes transistors 428-1 and 428-2, which are implemented as n-channel MOSFETs. Gate terminals of the transistors 428-1 and 428-2 are coupled to the gain-stabilization circuit 132 and accept the amplification control signal 408. Source terminals of the transistors 428-1 and 428-2 are respectively coupled to the drain terminals of the input transistors 426-1 and 426-2. Drain terminals of the transistors 428-1 and 428-2 are coupled to the output stage 414.

The output stage 414 includes capacitors 430-1 and 430-2, which are respectively coupled to the drain terminals of the transistors 428-1 and 428-2. The capacitors 430-1 and 430-2 are also coupled to the ground 422 and the reset stage 416. The output stage 414 provides the output signal 404, which is represented by differential voltages 404-1 and 404-2.

The reset stage 416 includes transistors 432-1 and 432-2, which are implemented as p-channel MOSFETs. Gate terminals of the transistors 432-1 and 432-2 accept the reset signal 424. Source terminals of the transistors 432-1 and 432-2 are coupled to the supply voltage 420 (e.g., the supply voltage node). Drain terminals of the transistors 432-1 and 432-2 are respectively coupled to the drain terminals of the transistors 428-1 and 428-2 and the capacitors 430-1 and 430-2.

The current source 418 can be implemented using a transistor 434, which is an n-channel MOSFET. A gate terminal of the transistor 434 is coupled to the gain-stabilization circuit 132 and accepts the bias voltage 406. A drain terminal of the transistor 434 is coupled to the source terminals of the input transistors 426-1 and 426-2. A source terminal of the transistor 434 is coupled to the ground 422.

The example amplifier 130 illustrated in FIG. 4-2 utilizes NMOSFETs in the input stage 410, the cascode stage 412, and the current source 418. In other example implementations, the amplifier 130 can implement the input stage 410, the cascode stage 412, and the current source 418 using PMOSFETs. This PMOSFET-based amplifier can have a similar architecture as the NMOSFET-based amplifier 130 of FIG. 4-2, with the exception of the current source 418 being connected to the supply voltage 420 (instead of the ground 422 as shown in FIG. 4-2) and the reset stage 416 connected to the ground 422 (instead of the supply voltage 420 as shown in FIG. 4-2). Examples of the gain-stabilization circuit 132 are further described with respect to FIG. 5.

Figure 5:
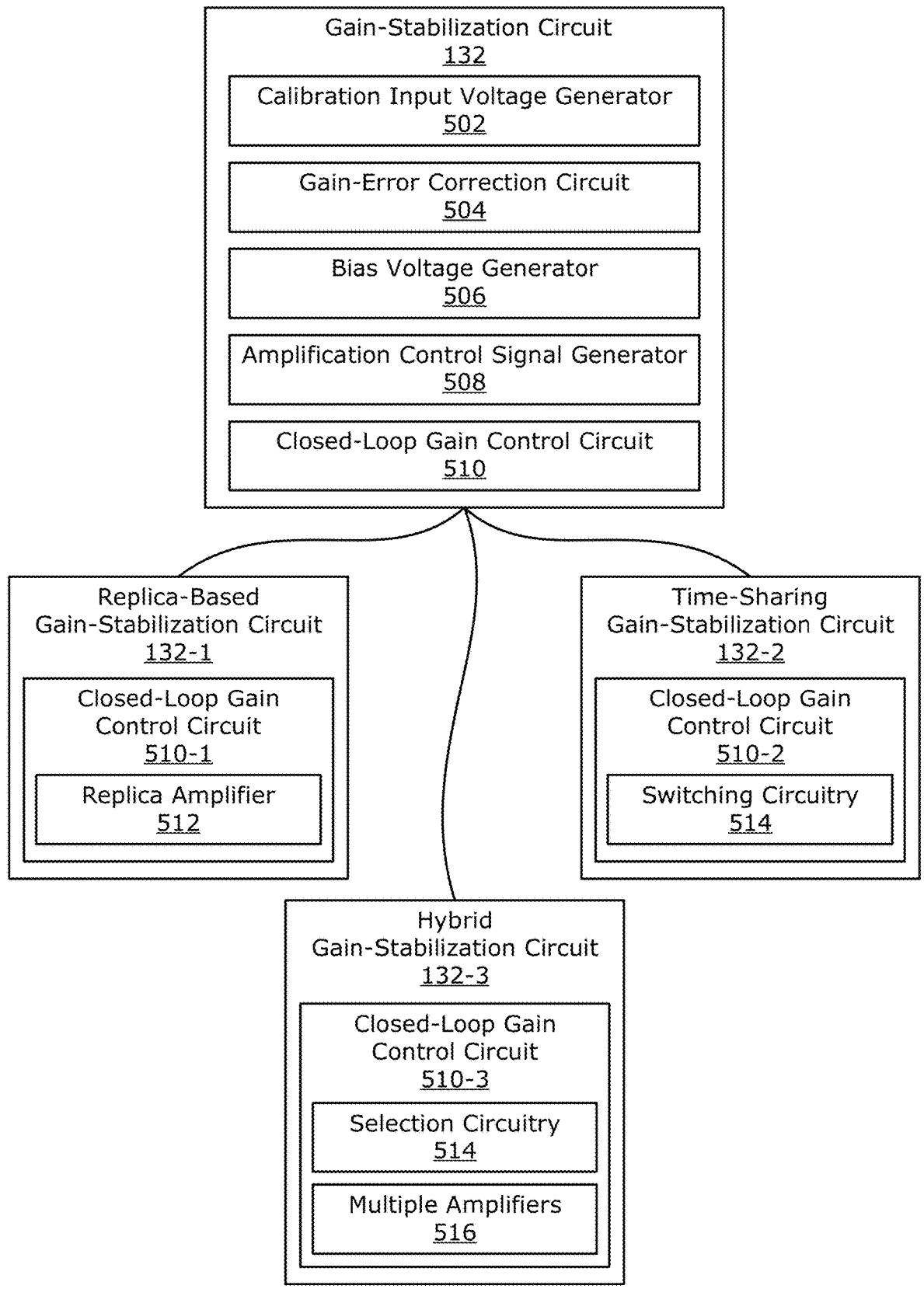
FIG. 5 illustrates example gain-stabilization circuits for gain stabilization.

FIG. 5 illustrates example gain-stabilization circuits 132 for gain stabilization. In the depicted configuration, the gain-stabilization circuit 132 includes at least one calibration input voltage generator 502, at least one gain-error correction circuit 504, at least one bias voltage generator 506, at least one amplification control signal generator 508, and at least one closed-loop gain control circuit 510. The calibration input voltage generator 502 generates a calibration input signal, which can have a predetermined voltage for calibration. The gain-error correction circuit 504 adjusts the bias voltage 406 (e.g., a bias current 436) and/or the amplification control signal 408 based on a determined gain error. The bias voltage generator 506 and the amplification control signal generator 508 respectively generate the bias voltage 406 and the amplification control signal 408. The closed-loop gain control circuit 510 enables the gain-stabilization circuit 132 to operate as a closed-loop system and provide negative feedback to stabilize the gain 409 of the amplifier 130.

A variety of different gain-stabilization circuits 132 can be implemented. Examples include a replica-based gain-stabilization circuit 132-1, a time-sharing gain-stabilization circuit 132-2, and a hybrid gain-stabilization circuit 132-3. The closed-loop gain control circuits 510-1 to 510-3 of the gain-stabilization circuits 132-1 to 132-3 can vary as described below.

The replica-based gain-stabilization circuit 132-1 includes a replica amplifier 512, which is implemented within the closed-loop gain control circuit 510-1. The replica amplifier 512 has an architecture that corresponds to the architecture of the amplifier 130. For example, the replica amplifier 512 can have an identical architecture as the amplifier 130. As another example, the replica amplifier 512 can be a scaled version of the amplifier 130 (e.g., have a smaller size and a smaller gain to conserve space and power). Because the replica amplifier 512 is related to the amplifier 130, a replica gain of the replica amplifier 512 is similarly affected by process, voltage, or temperature variations as the gain 409 of the amplifier 130.

The replica gain of the replica amplifier 512 is also based on the bias voltage 406 and the amplification control signal 408. Therefore, the replica-based gain-stabilization circuit 132-1 can evaluate the gain error associated with the replica amplifier 512 and adjust the bias voltage 406 and/or the amplification control signal 408 to "directly" stabilize the replica gain of the replica amplifier 512 and "indirectly" stabilize the gain 409 of the amplifier 130. The replica-based gain-stabilization circuit 132-1 is further described with respect to FIG. 6.

In some implementations, the replica-based gain-stabilization circuit 132-1 can compensate for a voltage offset or a flicker noise associated with the replica amplifier 512 to further improve the ability of the replica-based gain-stabilization circuit 132-1 to stabilize the gain 409 of the amplifier 130. For example, the replica-based gain-stabilization circuit 132-1 can include at least two switched-capacitor digital-to-analog converters respectively coupled at an input of the replica amplifier 512 and an output of the replica amplifier 512, as further described with respect to FIG. 7. As another example, the replica-based gain-stabilization circuit 132-1 can generate a calibration input voltage 610 with an alternate sign to compensate for the flicker noise or the DC offset. In this case, the replica-based gain-stabilization circuit 132-1 can include a switched-capacitor circuit driven by a constant DC reference voltage, a resistor driven by a DC current, or a voltage division circuit coupled to a power supply. In other cases, a sign of the calibration input voltage 610 can be alternated by crossing wires for differential implementations.

In some cases, there can be a small amount of mismatch between the replica amplifier 512 and the amplifier 130, which can reduce the ability of the gain-stabilization circuit 132 to stabilize the gain 409 of the amplifier 130. To address this problem, the gain-stabilization circuit 132 can alternatively be implemented as the time-sharing gain-stabilization circuit 132-2.

Instead of using the replica amplifier 512 of the replica-based gain-stabilization circuit 132-1, the time-sharing gain-stabilization circuit 132-2 includes switching circuitry 514. The switching circuitry 514 is implemented within the closed-loop gain control circuit 510-2 and enables the gain-stabilization circuit 132-2 to use the amplifier 130 for calibration during periods of time in which it is not in use by the computing device 102 (e.g., not in use by the analog-to-digital converter 124). The switching circuitry 514 can be implemented using multiplexers, switches, digital logic circuits, or some combination thereof.

During time periods in which the amplifier 130 is not being used for mission-mode amplification, the time-sharing gain-stabilization circuit 132-2 determines the gain error of the amplifier 130 and adjusts the bias voltage 406 and/or the amplification control signal 408 to "directly" stabilize the gain of the amplifier 130. The time-sharing gain-stabilization circuit 132-2 is further described with respect to FIGS. 8 and 9.

The time-sharing gain-stabilization circuit 132-2 differs from the replica-based gain-stabilization circuit 132-1 because it can measure the gain error of the amplifier 130 and avoid the disadvantages of device mismatch between the amplifier 130 and the replica amplifier 512 of the replica-based gain-stabilization circuit 132-1. However, the calibration of the amplifier 130 is limited to time periods in which the amplifier 130 is available and not in use (e.g., for a mission-mode such as analog-to-digital conversion). To address this problem, the gain-stabilization circuit 132 can alternatively be implemented as the hybrid gain-stabilization circuit 132-3.

The hybrid gain-stabilization circuit 132-3 combines elements of the replica-based gain-stabilization circuit 132-1 and elements of the time-sharing gain-stabilization circuit 132-2 together. In particular, the closed-loop gain control circuit 510-3 of the hybrid gain-stabilization circuit 132-3 includes the switching circuitry 514 and multiple amplifiers 516. Example quantities of the multiple amplifiers 516 can include, for example, 2, 4, 8, 10, or more. Each of the multiple amplifiers 516 can selectively operate as the amplifier 130 to provide amplification for a mission-mode or operate as the replica amplifier 512 to provide amplification for calibration.

With multiple amplifiers 516, the calibration process can occur during the same time period as the mission-mode. Furthermore, by implementing larger quantities of the multiple amplifiers 516 and alternatively switching between using different amplifiers 516 for the mission-mode or calibration, the negative effects of device mismatch can be substantially suppressed.

In general, the hybrid gain-stabilization circuit 132-3 utilizes dynamic element matching to address disadvantages associated with the replica-based gain-stabilization circuit 132-1 and the time-sharing gain-stabilization circuit 132-2. However, the cost and area of the hybrid gain-stabilization circuit 132-3 can be larger compared to the replica-based gain-stabilization circuit 132-1 and the time-sharing gain-stabilization circuit 132-2. The hybrid gain-stabilization circuit 132-3 is further described with respect to FIG. 10.

Figure 6:
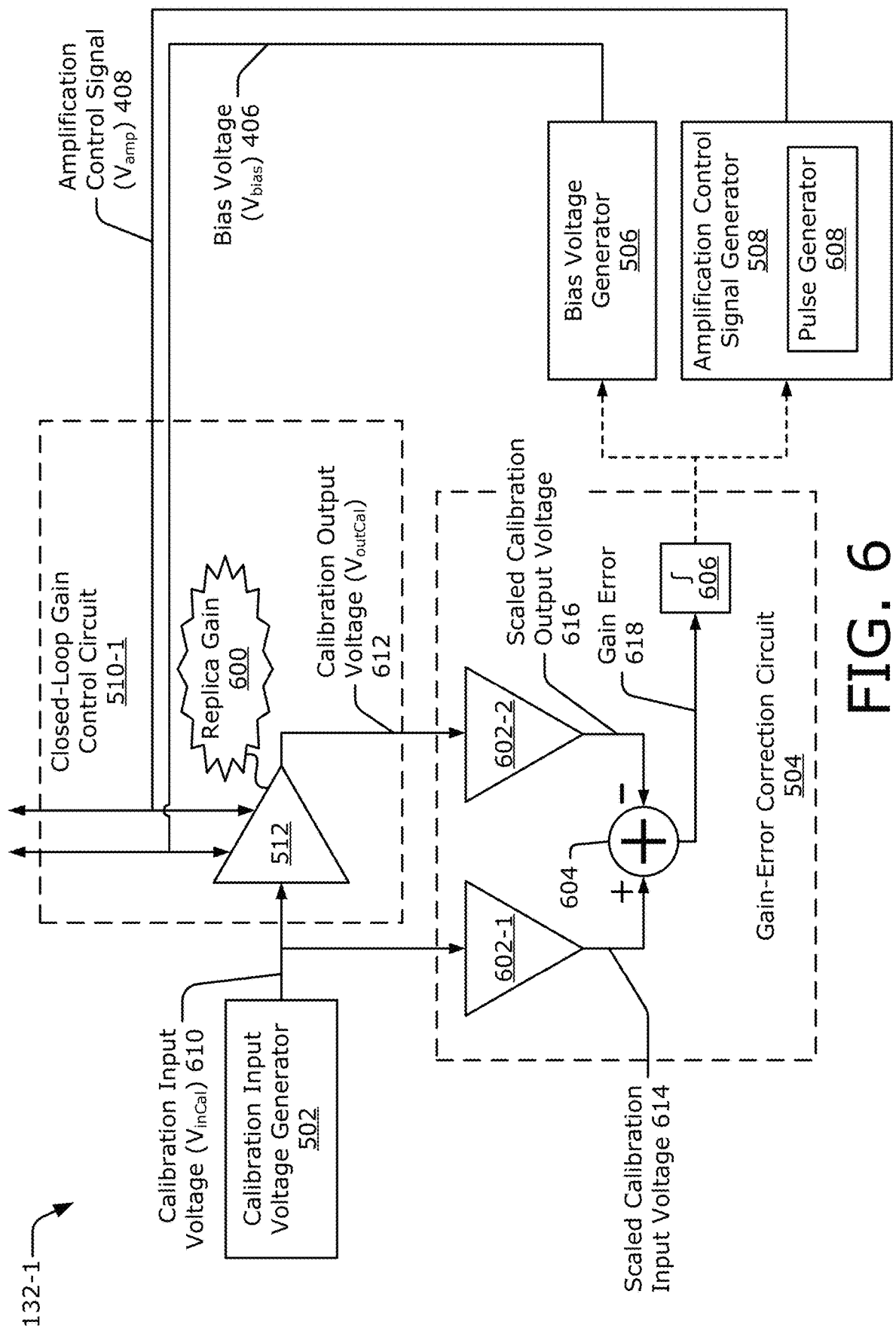
FIG. 6 illustrates an example replica-based gain-stabilization circuit for gain stabilization.

FIG. 6 illustrates an example replica-based gain-stabilization circuit 132-1 for gain stabilization. In the depicted configuration, the calibration input voltage generator 502 is coupled to the gain-error correction circuit 504 and the closed-loop gain control circuit 510-1. The gain-error correction circuit 504 can be coupled to the bias voltage generator 506, the amplification control signal generator 508, or both.

If the gain-error correction circuit 504 is coupled to the bias voltage generator 506, the replica-based gain-stabilization circuit 132-1 can adjust the bias voltage 406 to provide gain stabilization. Alternatively, if the gain-error correction circuit 504 is coupled to the amplification control signal generator 508, the replica-based gain-stabilization circuit 132-1 can adjust the amplification control signal 408 to provide gain stabilization. In another example implementation, the gain-error correction circuit 504 is coupled to both the bias voltage generator 506 and the amplification control signal generator 508, which enables the replica-based gain-stabilization circuit 132-1 to adjust both the bias voltage 406 and the amplification control signal 408.

The closed-loop gain control circuit 510-1 is coupled to the bias voltage generator 506, the amplification control signal generator 508, and the amplifier 130 (e.g., of FIG. 4-1). Using the closed-loop gain control circuit 510-1, the bias voltage generator 506, and the amplification control signal generator 508, the gain-stabilization circuit 132-1 can feed back the adjusted bias voltage 406 or the adjusted amplification control signal 408 to the amplifier 130 and the replica amplifier 512.

In an example implementation, the gain-error correction circuit 504 includes at least two scalers 602-1 and 602-2, at least one combiner 604, and at least one integrator 606. The scaler 602-1 is coupled to the calibration input voltage generator 502, an input of the replica amplifier 512, and an input of the combiner 604. The scaler 602-2 is coupled between an output of the replica amplifier 512 and another input of the combiner 604. The scalers 602-1 and 602-2 can appropriately scale signals for the comparison operation performed by the combiner 604. The scalers 602-1 and 602-2 can be implemented as passive scalers (e.g., attenuators) or active scalers (e.g., amplifiers).

An output of the combiner 604 is coupled to an input of the integrator 606. In some implementations, the scalers 602-1 and 602-2 and the combiner 604 are implemented together using switched capacitors.

An output of the integrator 606 is coupled to the bias voltage generator 506, the amplification control signal generator 508, or both. The amplification control signal generator 508 includes a pulse generator 608, which controls the pulsewidth of the amplification control signal 408 based on a clock signal (not shown).

In some implementations, the replica-based gain correction circuit 132-1 includes a first sign alternator at the output of the calibration input voltage generator 502 and a second sign alternator at the input of the integrator 606. Using the sign alternators, the replica-based gain correction circuit 132-1 can compensate for the flicker noise and the DC offset.

The closed-loop gain control circuit 510-1 includes the replica amplifier 512, which is coupled to the calibration input voltage generator 502, the gain-error correction circuit 504, the bias voltage generator 506, the amplification control signal generator 508, and the amplifier 130 (e.g., as shown in FIG. 4-1). The replica amplifier 512 performs amplification for calibration, which can occur during time intervals in which the amplifier 130 is providing amplification for another operation (e.g., a mission mode such as analog-to-digital conversion) or during time intervals in which the amplifier 130 is not in use. In some implementations, the replica amplifier 512 can operate less frequently than the amplifier 130 to conserve power.

During calibration, the replica-based gain-stabilization circuit 132-1 adjusts the bias voltage 406 or the amplification control signal 408 (including both in some cases) based on a gain error of the replica amplifier 512 to "directly" stabilize a replica gain 600 of the replica amplifier 512 and to "indirectly" stabilize the gain of the amplifier 130. In particular, the calibration input voltage generator 502 generates a calibration input voltage ($V_{inCal}$) 610, which is provided to the replica amplifier 512. The replica amplifier 512 amplifies the calibration input voltage 610 and generates a calibration output voltage ($V_{outCal}$) 612.

The scalers 602-1 and 602-2 can respectively scale the calibration input voltage 610 and the calibration output voltage 612 to generate a scaled calibration input voltage 614 and a scaled calibration output voltage 616. As an example, the scaler 602-1 can scale the calibration input voltage 610 by a factor of $A_r/(1+A_r)$, where $A_r$ represents a target replica gain of the replica amplifier 512. The scaler 602-2 can scale the calibration output voltage 612 by a factor of $1/(1+A_r)$.

The combiner 604 compares the scaled calibration input voltage 614 and the scaled calibration output voltage 616 to determine a gain error 618. The combiner 604 can be implemented as a summation circuit or a comparator. In an example implementation, the combiner 604 can subtract the scaled calibration output voltage 616 from the scaled calibration input voltage 614 (or vice versa) to determine the gain error 618. The integrator 606 integrates the gain error 618, and provides this integrated value to the bias voltage generator 506 and/or the amplification control signal generator 508.

In general, the gain error 618 indicates an amount by which the replica gain 600 of the replica amplifier 512 differs from the target replica gain. To cause the replica gain 600 to approach (e.g., become approximately equal to) the target replica gain, the gain-error correction circuit 504 can adjust the bias voltage 406 and/or the pulsewidth of the amplification control signal 408. For example, the gain-error correction circuit 504 can increase the bias current 436 by increasing the bias voltage 406 if the current source 418 uses NMOSFETs or decreasing the bias voltage 406 if the current source 418 uses PMOSFETs. Additionally or alternatively, the gain-error correction circuit 504 can increase the pulsewidth of the amplification control signal 408 to increase the replica gain 600. Alternatively, the gain-error correction circuit 504 can decrease the bias voltage 406 and/or the pulsewidth of the amplification control signal 408 to decrease the replica gain 600.

The bias voltage generator 506 can adjust the bias voltage 406 based on the gain error 618. Also or instead, the amplification control signal generator 508 can adjust the pulsewidth of the amplification control signal 408 based on the gain error 618. The adjusted bias voltage 406 and/or the adjusted amplification control signal 408 are fed back to the replica amplifier 512 and the amplifier 130.

The calibration process described above can be performed multiple times to incrementally adjust the replica gain 600 of the replica amplifier 512 to a substantially stable level that is proximate to a target replica gain. Because of the relationship between the replica amplifier 512 and the amplifier 130 (e.g., by having corresponding architectures), the gain 409 of the amplifier 130 is also substantially stabilized. As an example, the gains 409 and 600 of the amplifier 130 and the replica amplifier 512 can remain within a percentage threshold over various process, voltage, and/or temperature ranges. As an example, the percentage threshold can be less than approximately 5%, 2%, or 1%. An example differential implementation of the replica amplifier 512 is further described with respect to FIG. 7.

Figure 7:
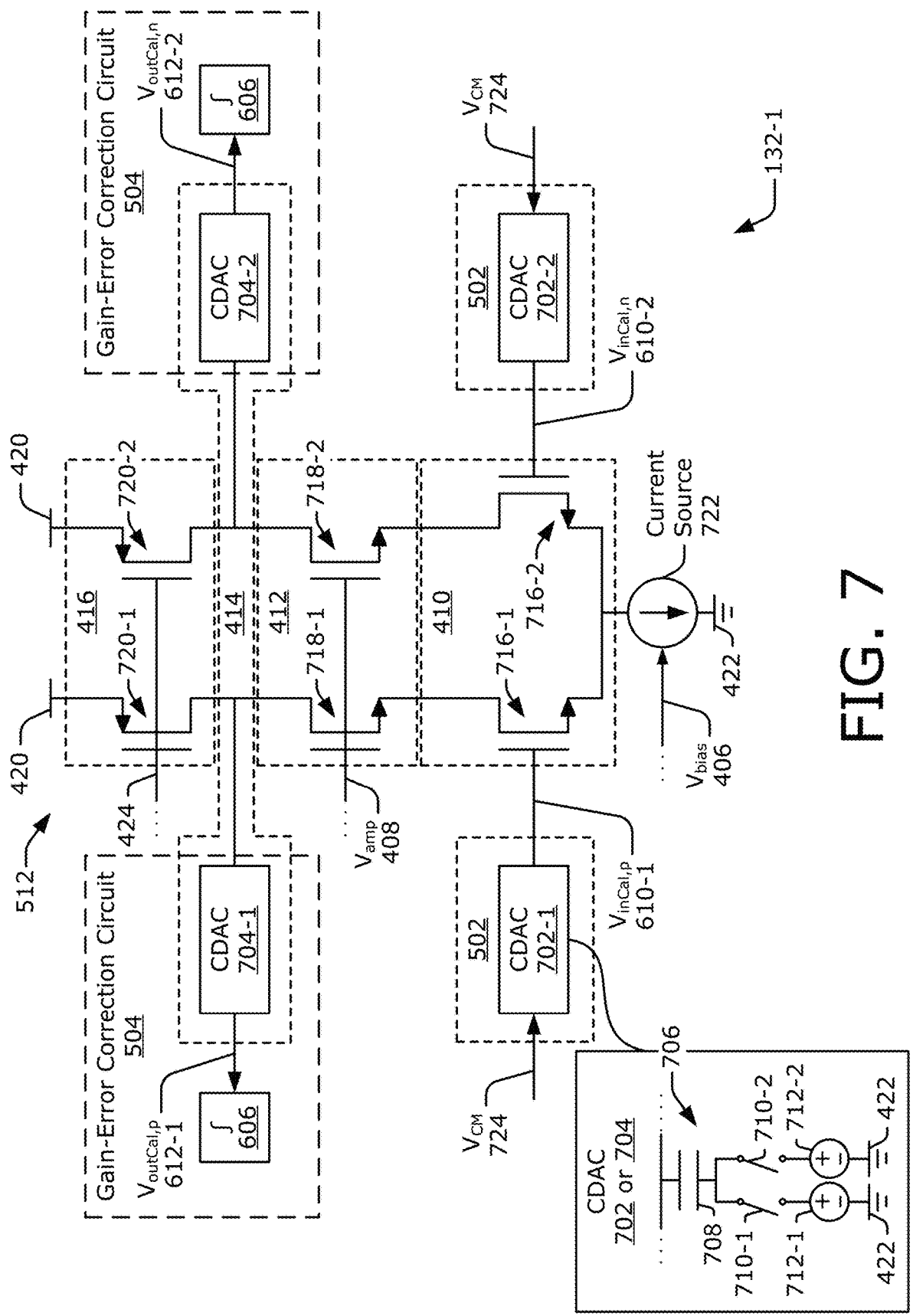
FIG. 7 illustrates an example portion of a replica-based gain-stabilization circuit implemented using switched-capacitor digital-to-analog converters.

FIG. 7 illustrates an example portion of a replica-based gain-stabilization circuit 132-1 implemented using multiple switched-capacitor digital-to-analog converters (CDAC). In the depicted configuration, the replica-based gain-stabilization circuit 132-1 includes a pair of input switched-capacitor digital-to-analog converters (CDAC) 702-1 and 702-2 and a pair of output switched-capacitor digital-to-analog converters 704-1 and 704-2.

Each of the switched-capacitor digital-to-analog converters 702-1, 702-2, 704-1, and 704-2 includes one or more branches 706 coupled together in parallel. In an example implementation, each branch 706 includes at least one capacitor 708, at least two switches 710-1 and 710-2, and at least two reference voltages 712-1 and 712-2. The switch 710-1 is coupled between the reference voltage 712-1 and the capacitor 708. The switch 710-2 is coupled between the reference voltage 712-2 and the capacitor 708. The reference voltages 712-1 and 712-2 are coupled to the ground 422. The switched-capacitor digital-to-analog converters 702-1, 702-2, 704-1, and 704-2 can selectively connect different combinations of branches 706 to the reference voltage 712-1 or the reference voltage 712-2.

In the depicted configuration, the replica amplifier 512 is shown to be implemented as a dynamic amplifier 400 (FIG. 4-1), which has a similar architecture and operation as the amplifier 130 of FIG. 4-2. For example, the replica amplifier 512 includes the input stage 410, the cascode stage 412, the output stage 414, and the reset stage 416. The input stage 410 includes input transistors 716-1 and 716-2, which are implemented as n-channel MOSFETs. The cascode stage 412 includes transistors 718-1 and 718-2, which are implemented as n-channel MOSFETs. The reset stage 416 includes transistors 720-1 and 720-2, which are implemented as p-channel MOSFETs.

The output stage 414 of the replica amplifier 512 is at least partially implemented by the capacitors 708 within the output switched-capacitor digital-to-analog converters 704-1 and 704-2. The replica amplifier 512 also includes a current source 722, which can be similar to the current source 418 of the amplifier 130.

In this example implementation, the input switched-capacitor digital-to-analog converters 702-1 and 702-2 at least partially implement the calibration input voltage generator 502. Using the input switched-capacitor digital-to-analog converters 702-1 and 702-2, the calibration input voltage generator 502 can scale a common-mode voltage 724 to generate differential voltages 610-1 and 610-2 associated with the calibration input voltage 610. With the ability to dynamically set the calibration input voltages 610-1 and 610-2 using the input switched-capacitor digital-to-analog converters 702-1 and 702-2, the calibration input voltage generator 502 can control the overall gain of the feedback loop implemented by the replica-based gain-stabilization circuit 132-1.

The output switched-capacitor digital-to-analog converters 704-1 and 704-2 at least partially implement the gain-error correction circuit 504. In particular, the output switched-capacitor digital-to-analog converters 704-1 and 704-2 can implement the scalers 602-1 and 602-2 and the combiner 604 of the gain-error correction circuit 504. The output switched-capacitor digital-to-analog converters 704-1 and 704-2 can scale the calibration output voltage 612, which is represented by differential voltages 612-1 and 612-2.

Together, the switched-capacitor digital-to-analog converters 702-1, 702-2, 704-1, and 704-2 can perform chopping to attenuate the flicker noise and compensate for voltage offsets. In particular, the input switched-capacitor digital-to-analog converters 702-1 and 702-2 can digitally scale the common-mode voltage 724 to generate the voltages 610-1 and 610-2 at the input of the replica amplifier 512. Also, the gain-error correction circuit 504 can remove this digital scaling at the output stage 414 to prevent the scaling from affecting the determined gain error 618 (of FIG. 6).

With the switched-capacitor digital-to-analog converters 702-1, 702-2, 704-1, and 704-2, the replica-based gain-stabilization circuit 132-1 can have a structure with parasitics that resembles a structure and parasitics of the amplifier 130 implemented within the pipeline analog-to-digital converter 300. This similarity can further enable the replica gain 600 of the replica amplifier 512 to track the gain 409 of the amplifier 130, including over fluctuating temperatures and voltages.

Figure 8:
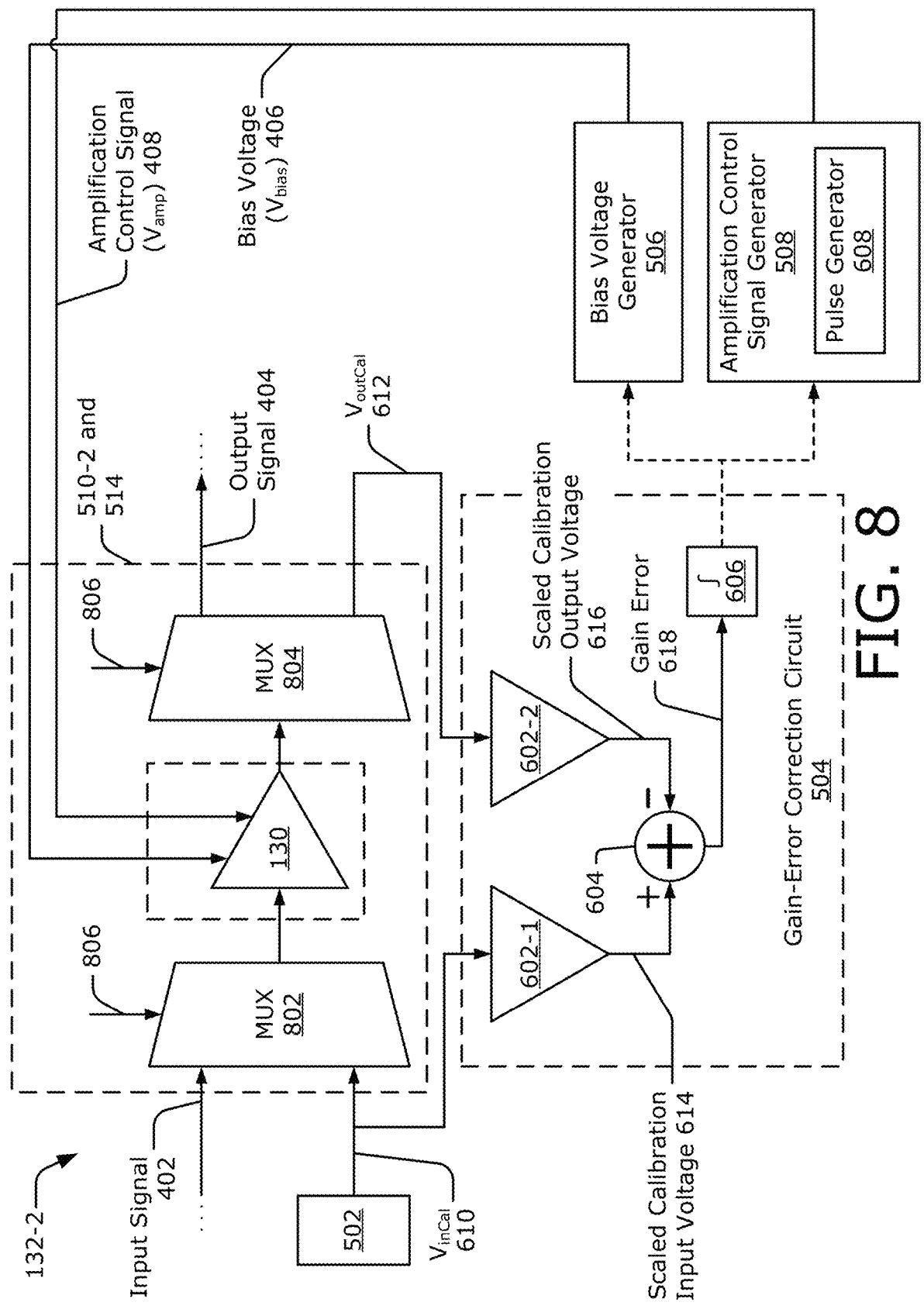
FIG. 8 illustrates an example time-sharing gain-stabilization circuit for gain stabilization.

FIG. 8 illustrates an example time-sharing gain-stabilization circuit 132-2 for gain stabilization. In the depicted configuration, the calibration input voltage generator 502 is coupled to the gain-error correction circuit 504 and the closed-loop gain control circuit 510-2. The gain-error correction circuit 504 can be coupled to the bias voltage generator 506, the amplification control signal generator 508, or both.

If the gain-error correction circuit 504 is coupled to the bias voltage generator 506, the time-sharing gain-stabilization circuit 132-2 can adjust the bias voltage 406 to provide gain stabilization. Alternatively, if the gain-error correction circuit 504 is coupled to the amplification control signal generator 508, the time-sharing gain-stabilization circuit 132-2 can adjust the amplification control signal 408 to provide gain stabilization. In another example implementation, the gain-error correction circuit 504 is coupled to both the bias voltage generator 506 and the amplification control signal generator 508, which enables the time-sharing gain-stabilization circuit 132-2 to adjust both the bias voltage 406 and the amplification control signal 408.

The operation of the time-sharing gain-stabilization circuit 132-2 is similar to that of the replica-based gain-stabilization circuit 132-1 except the time-sharing gain-stabilization circuit 132-2 determines the gain error 618 of the amplifier 512 instead of the gain error 618 of the replica amplifier 512. To determine the gain error 618 of the amplifier 130, the amplifier 130 is time-shared and selectively provides amplification for a mission-mode operation of the amplification circuit 128 (e.g., providing amplification for analog-to-digital conversion) or provides amplification for calibration.

To enable time-sharing of the amplifier 130, the closed-loop gain-control circuit 510-2 includes the switching circuitry 514. In an example implementation, the switching circuitry 514 includes at least one input multiplexer 802 and at least one output multiplexer 804. The input multiplexer 802 selectively provides the input signal 402 or the calibration input voltage 610 to the input of the amplifier 130. In other words, the input multiplexer 802 selectively connects the input of the amplifier 130 to an input of the amplification circuit 128 for the mission-mode or connects the input of the amplifier 130 to the calibration input voltage generator 502 for calibration.

The output multiplexer 804 selectively provides a signal generated at the output of the amplifier 130 as the output signal 404 or the calibration output voltage 612. In other words, the output multiplexer 804 selectively connects the output of the amplifier 130 to the output of the amplification circuit 128 for the mission-mode or connects the output of the amplifier 130 to the gain-error correction circuit 504 for calibration.

Operations of the multiplexers 802 and 804 are controlled by a calibration control signal 806. The calibration control signal 806 can be generated by the time-sharing gain-stabilization circuit 132-2, provided by the pipeline analog-to-digital converter 300, or provided by another component within the computing device 102, such as the modem 126. In some implementations, the amplifier 130 is implemented with multiple amplification branches, which enables the switching circuitry 514 to utilize current steering to avoid implementing the output multiplexer 804. In some cases, the output multiplexer 804 can be challenging to implement due to the amount of voltage swing that occurs at the output of the amplifier 130. This implementation is further described in FIG. 9.

Figure 9:
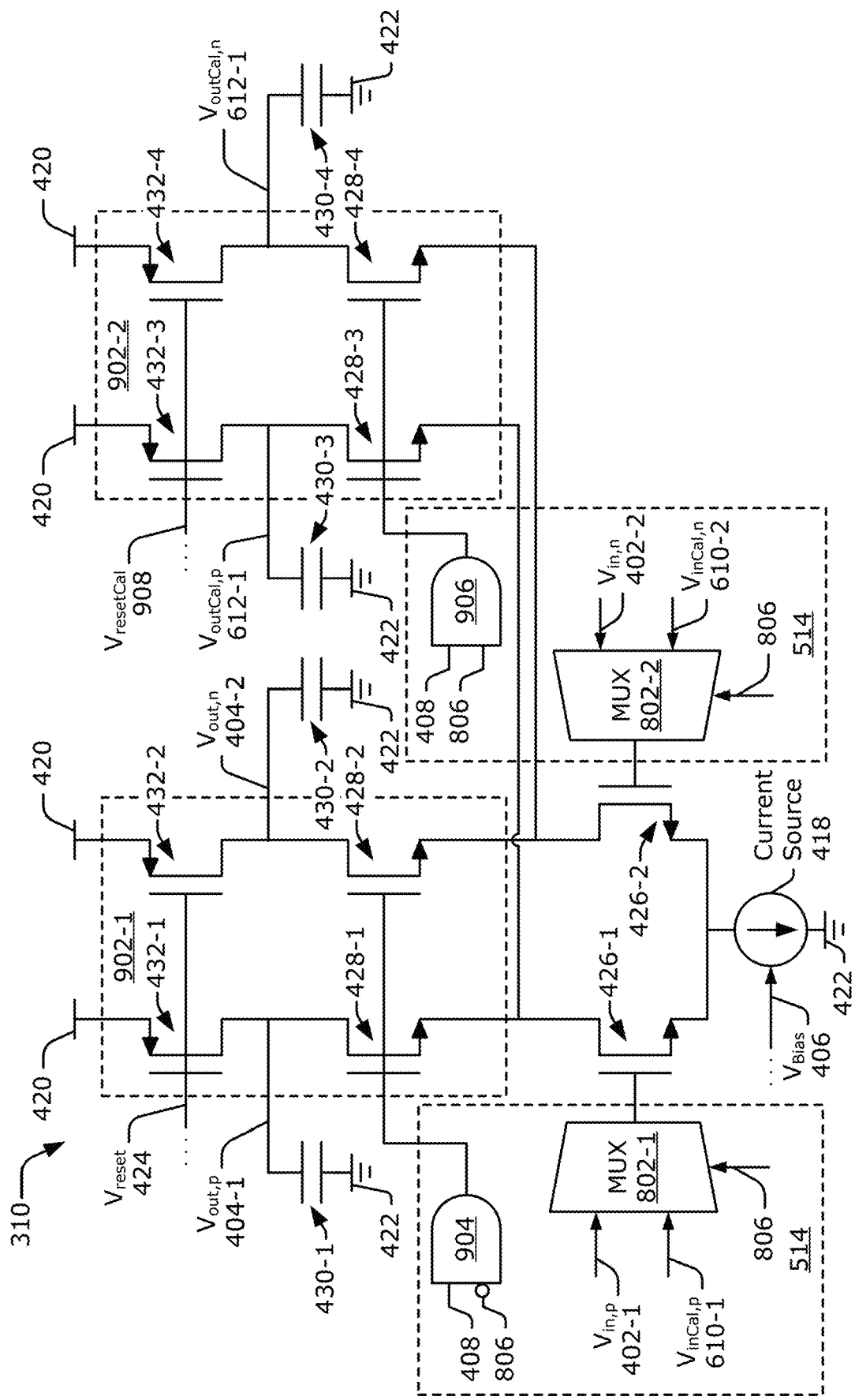
FIG. 9 illustrates an example amplifier with multiple amplification branches and example switching circuitry for gain stabilization.

FIG. 9 illustrates an example amplifier 130 with multiple amplification branches 902-1 and 902-2, and example switching circuitry 514 for gain stabilization. In the depicted configuration, a first amplification branch 902-1 and a second amplification branch 902-2 represent parallel branches that are connected between the supply voltage 420 and the input transistors 426-1 and 426-2 of the amplifier 130. The first amplification branch 902-1 includes the transistors 428-1 and 428-2 of the cascode stage 412 and the transistors 432-1 and 432-2 of the reset stage 416. Additionally, the first amplification branch 902-1 includes capacitors 430-1 and 430-2, which implement the output stage 414.

The second amplification branch 902-2 is similar to the first amplification branch 902-1. For example, the second amplification branch 902-2 includes transistors 428-3 and 428-4, which implement a cascode stage 412. The transistors 428-3 and 428-4 can be similar to the transistors 428-1 and 428-2 within the first amplification branch 902-1. The second amplification branch 902-2 also includes transistors 432-3 and 432-4, which implement a reset stage 416. The transistors 432-3 and 432-4 can be similar to the transistors 432-1 and 432-2 within the first amplification branch 902-1. The second amplification branch 902-2 also includes capacitors 430-3 and 430-4, which implement an output stage 414. The capacitors 430-3 and 430-4 can be similar to the capacitors 430-1 and 430-2.

The switching circuitry 514 includes two input multiplexers 802-1 and 802-2, which selectively pass the input signal 402 (e.g., the differential voltages 402-1 and 402-2) or the calibration input voltage 610 (e.g., the differential voltages 610-1 and 610-2) to the input transistors 426-1 and 426-2 according to the calibration control signal 806.

The switching circuitry 514 also includes a digital logic circuit to selectively enable a primary operation of the amplification circuit 128 (e.g., providing amplification for analog-to-digital conversion) or calibration. For example, the switching circuitry 514 includes a first logic gate 904 (e.g., an AND gate) and a second logic gate 906 (e.g., another AND gate). The first logic gate 904 is coupled to gates of the transistors 428-1 and 428-2 within the first amplification branch 902-1. The first logic gate 904 enables the first amplification branch 902-1 to support the primary operation of the amplification circuit 128 if the calibration control signal 806 is at a low state and the amplification control signal 408 is at a high state.

The second logic gate 906 is coupled to gates of the transistors 428-3 and 428-4 within the second amplification branch 902-2. The second logic gate 906 enables the second amplification branch 902-2 to provide amplification for calibration if the calibration control signal 806 is at a high state and the amplification control signal 408 is at a high state. In this way, the amplifier 130 can selectively use the first amplification branch 902-1 to support the primary operation of the amplification circuit 128 or the second amplification branch 902-2 for calibration. By enabling the first amplification branch 902-1 or the second amplification branch 902-2, the switching circuitry 514 effectively steers an output current of the amplifier 130 to the output stage 414 associated with the first amplification branch 902-1 or the output stage 414 associated with the second amplification branch 902-2. In some cases, it can be easier to implement the switching circuitry 514 of FIG. 9 relative to the switching circuitry 514 of FIG. 8.

Figure 10:
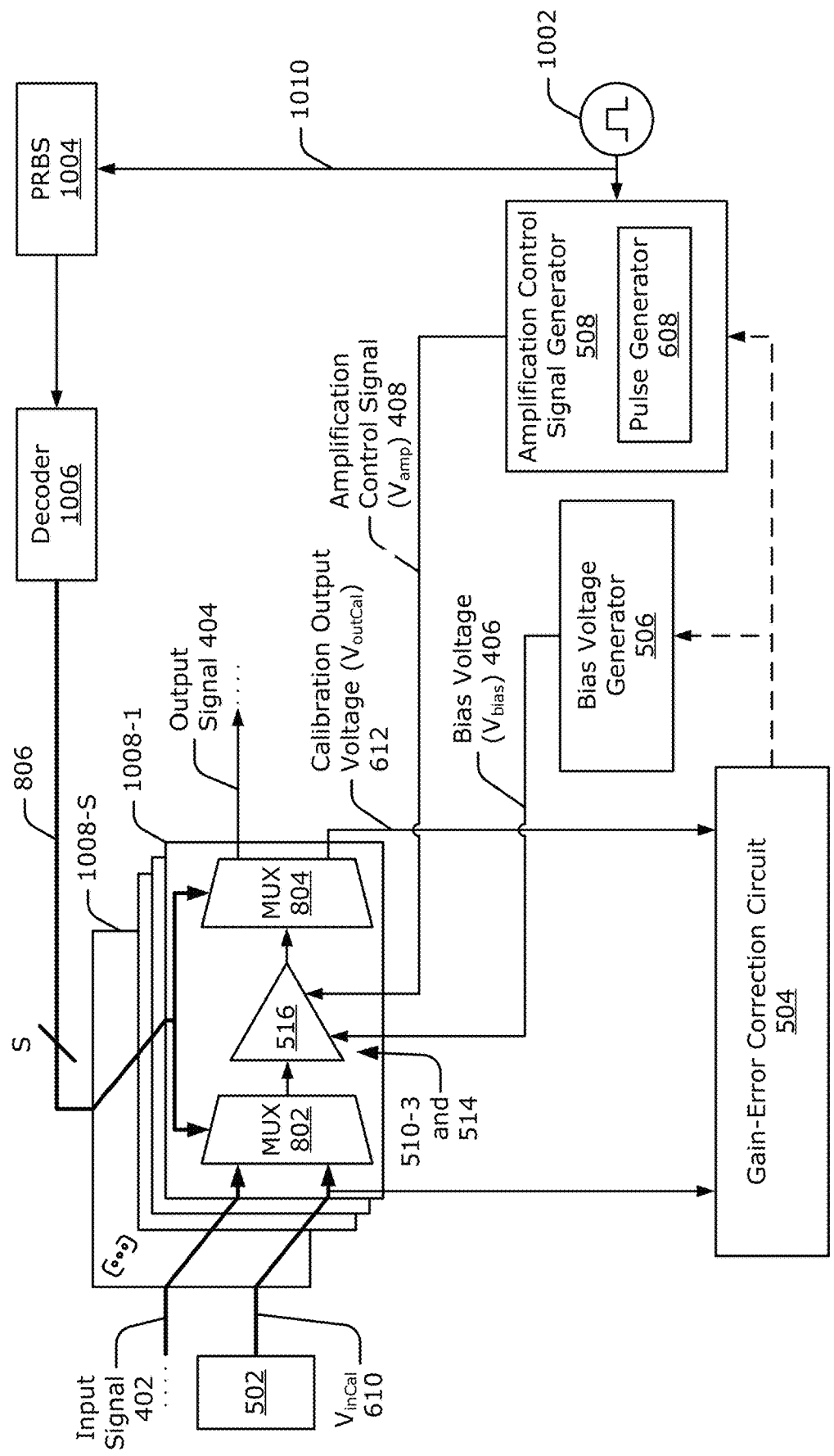
FIG. 10 illustrates an example hybrid gain-stabilization circuit for gain stabilization.

FIG. 10 illustrates an example hybrid gain-stabilization circuit 132-3 for gain stabilization. In the depicted configuration, the hybrid gain-stabilization circuit 132-3 includes the calibration input voltage generator 502, the gain-error correction circuit 504, the bias voltage generator 506, the amplification control signal generator 508, and the closed-loop gain control circuit 510-3. Various implementations of the hybrid gain-stabilization circuit 132-3 can connect an output of the gain-error correction circuit 504 to the bias voltage generator 506 and/or the amplification control signal generator 508. Accordingly, the hybrid gain-stabilization circuit 132-3 can be designed to adjust the bias voltage 406, the amplification control signal 408, or both the bias voltage 406 and the amplification control signal 408.

The hybrid gain-stabilization circuit 132-3 also includes at least one clock generator 1002, at least one pseudorandom bit sequence generator 1004 (PRBS 1004), and at least one decoder 1006. The decoder 1006 can be implemented as a 1-of-S decoder, which sets one of its outputs to a high state.

The hybrid gain-stabilization circuit 132-3 additionally includes multiple amplification slices 1008-1 to 1008-S, where S represents a positive integer. The multiple amplification slices 1008-1 to 1008-S are implemented in parallel with each other. As such, the multiple amplification slices 1008-1 to 1008-S can accept the input signal 402, the calibration input voltage 610, the bias voltage 406, and the amplification controls signal 408. The multiple amplification slices 1008-1 to 1008-S can also generate the output signal 404 and the calibration output voltage 612. Each amplification slice 1008-1 to 1008-S includes the closed-loop gain control circuit 510-3. In particular, each amplification slice 1008-1 to 1008-S includes the switching circuitry 514 and one of the multiple amplifiers 516. The multiple amplifiers 516 can be implemented as dynamic amplifier 400.

In FIG. 10, the switching circuitry 514 is implemented using the multiplexers 802 and 804. Alternatively, the amplifier 516 can include multiple amplification branches 902 and the switching circuitry 514 can be implemented using at least one input multiplexer 802 and a digital logic circuit, similar to the switching circuitry 514 of FIG. 9.

During operation, the hybrid gain-stabilization circuit 132-3 enables one of the amplification slices 1008-1 to 1008-S for calibration and enables the remaining amplification slices 1008-1 to 1008-S for the primary operation of the amplification circuit 128. In this way, the multiple amplification slices 1008-1 to 1008-S enable amplification for calibration and amplification for the mission-mode to occur in parallel (e.g., concurrently).

In some implementations, the amplification slice 1008-1 to 1008-S selected for calibration is chosen based on a pseudorandom process. In other implementations, the selection of the amplification slice 1008-1 to 1008-S for calibration can be selected based on a defined process or selection order. In general, the amplification slice 1008-1 to 1008-S selected for calibration varies over time to reduce the effects of mismatch. An example pseudorandom process is further described below.

The clock generator 1002 generates a clock signal 1010, which is passed to the pulse generator 608 and the pseudorandom bit sequence generator 1004. The pseudorandom bit sequence generator 1004 generates a pseudorandom signal based on the clock signal 1010. The pseudorandom signal identifies which of the amplification slices 1008-1 to 1008-S is to be used for calibration. In some cases, this decision can be made on a falling edge of the clock signal 1010 so that the configuration change does not disturb the amplification provided by the amplification slices 1008-1 to 1008-S. The decoder 1006 receives the digital output from the pseudorandom bit sequence generator 1004 and generates the calibration control signal 806, which enables one of the amplification slices 1008-1 to 1008-S for calibration.

Figure 11:
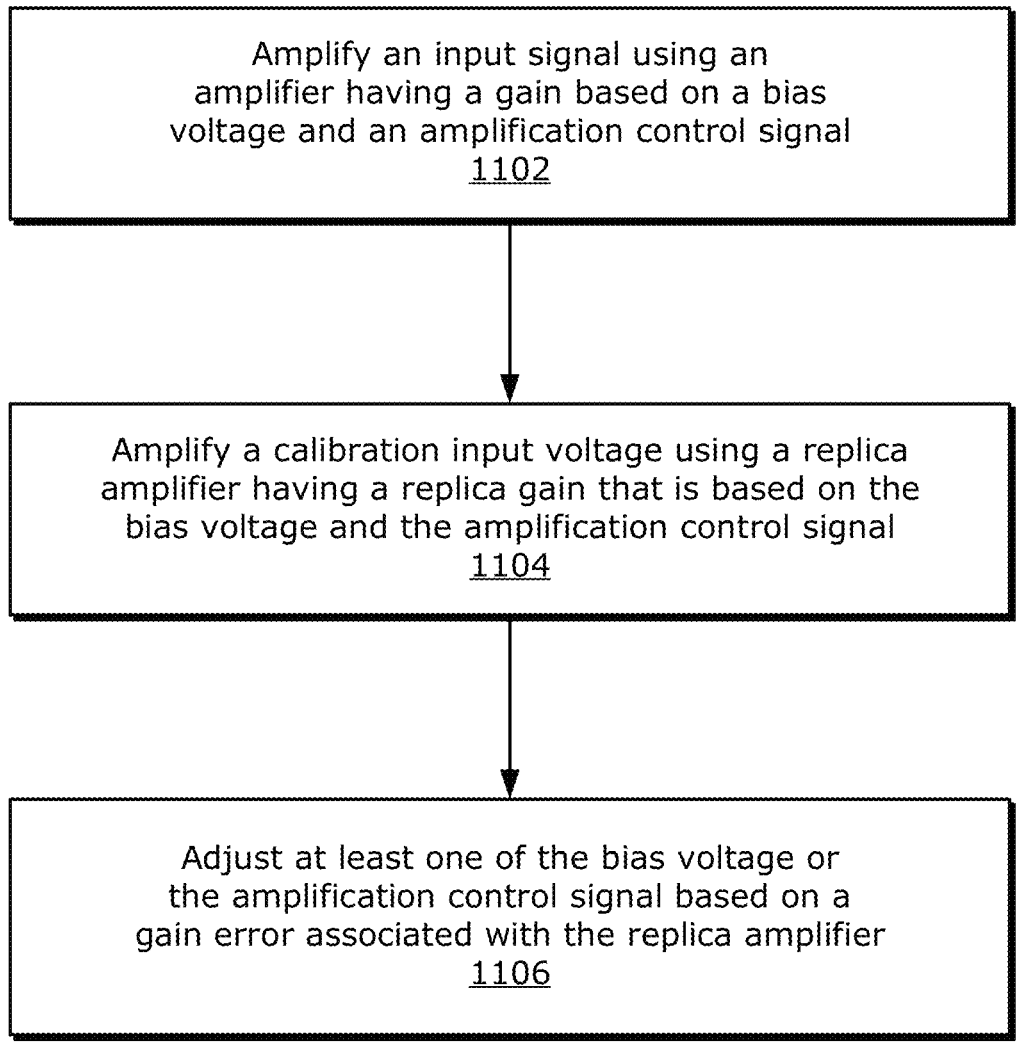
FIG. 11 is a flow diagram illustrating an example process for gain stabilization.

FIG. 11 is a flow diagram illustrating an example process 1100 for gain stabilization. The process 1100 is described in the form of a set of blocks 1102-1106 that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the process 1100, or an alternative process. Operations represented by the illustrated blocks of the process 1100 may be performed by an analog-to-digital converter 124 (e.g., of FIG. 1, 2, or 3) or an amplification circuit (e.g., of FIG. 4-1). More specifically, the operations of the process 1100 may be performed, at least in part, by a replica-based gain-stabilization circuit 132-1 as shown in FIG. 5, 6, or 7.

At block 1102, an input signal is amplified using an amplifier having a gain based on a bias voltage and an amplification control signal. For example, the amplifier 130 amplifies the input signal 402, as shown in FIG. 4-1. The amplifier 130 has a gain 409, which is based on the bias voltage 406 and the amplification control signal 408 (as described by Equation 1). In particular, the gain 409 of the amplifier 130 is proportional to the transconductance of the amplifier 130, which is dependent upon the bias voltage 406, and the pulsewidth of the amplification control signal 408.

At block 1104, a calibration input voltage is amplified using a replica amplifier having a replica gain that is based on the bias voltage and the amplification control signal. For example, the replica amplifier 512 amplifies the calibration input voltage 610, as shown in FIG. 6 or 7. The replica amplifier 512 has a replica gain 600 that is based on the bias voltage 406 and the amplification controls signal 408 (as described by Equation 1). The replica amplifier 512 also has an architecture that corresponds to an architecture of the amplifier 130. For example, both the amplifier 130 and the replica amplifier 512 can be implemented as dynamic amplifiers 400. In various implementations, the replica amplifier 512 can have a similar gain as the amplifier 130 or a different (e.g., a scaled) gain relative to the amplifier 130.

At block 1106, at least one of the bias voltage or the amplification control signal is adjusted based on a gain error associated with the replica amplifier. For example, the gain-stabilization circuit 132 adjusts the bias voltage 406 and/or the amplification control signal 408 based on the gain error 618 associated with the replica amplifier 512, as shown in FIG. 5.

Figure 12:
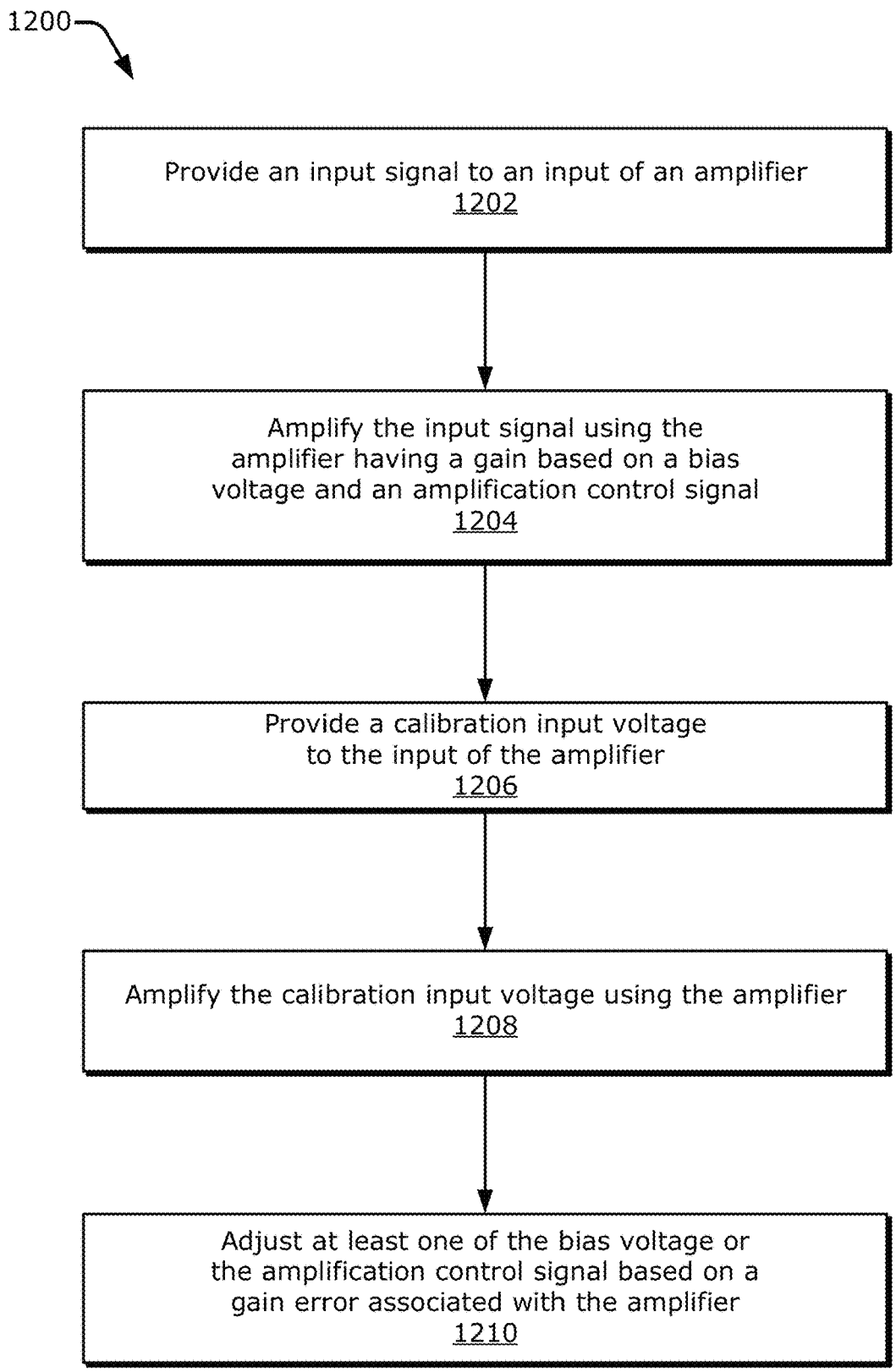
FIG. 12 is a flow diagram illustrating another example process for gain stabilization.

FIG. 12 is a flow diagram illustrating another example process 1200 for gain stabilization. The process 1200 is described in the form of a set of blocks 1202-1210 that specify operations that can be performed. However, operations are not necessarily limited to the order shown in FIG. 12 or described herein, for the operations may be implemented in alternative orders or in fully or partially overlapping manners. Also, more, fewer, and/or different operations may be implemented to perform the process 1200, or an alternative process. Operations represented by the illustrated blocks of the process 1200 may be performed by an analog-to-digital converter 124 (e.g., of FIG. 1, 2, or 3) or an amplification circuit (e.g., of FIG. 4). More specifically, the operations of the process 1200 may be performed, at least in part, by a time-sharing gain-stabilization circuit 132-2 as shown in FIG. 5, 8, or 9.

At block 1202, an input signal is provided to an input of an amplifier. For example, the switching circuitry 514 of the time-sharing gain-stabilization circuit 132-2 provides the input signal 402 to the input of the amplifier 130, as shown in FIGS. 8 and 9.

At block 1204, the input signal is amplified using the amplifier having a gain based on a bias voltage and an amplification control signal. For example, the amplifier 130 amplifies the input signal 402 and has a gain 409 that is based on the bias voltage 406 and the amplification control signal 408.

At block 1206, a calibration input voltage is provided to the input of the amplifier. For example, the switching circuitry 514 provides the calibration input voltage 610 to the input of the amplifier 130, as shown in FIGS. 8 and 9.

At block 1208, the calibration input voltage is amplified using the amplifier. For example, the amplifier 130 amplifies the calibration input voltage 610 to generate the calibration output voltage 612.

At block 1210, at least one of the bias voltage or the amplification control signal is adjusted based on a gain error associated with the amplifier. For example, the time-sharing gain-stabilization circuit 132-2 adjusts the bias voltage 406 or the amplification control signal 408 based on the gain error 618 associated with the amplifier 130, as shown in FIG. 8.

In the process 1200, the amplification of the input signal 402 (blocks 1202 and 1204) and the calibration (blocks 1206 to 1210) occur in series, as described with respect to the time-sharing gain-stabilization circuit 132-2. However, other processes can perform the amplification of the input signal 402 and the calibration in parallel using different portions of the circuitry, as described with respect to the hybrid grain-stabilization circuit 132-3 of FIG. 10. In some aspects, the processes 1100 and 1200 can be combined in some manner to support gain stabilization using the hybrid gain-stabilization circuit 132-3.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

Some aspects are described below.

Aspect 1: An apparatus comprising:
an amplifier having a gain that is based on a bias voltage and an amplification control signal; and
a gain-stabilization circuit coupled to the amplifier, the gain-stabilization circuit comprising:
a replica amplifier corresponding to the amplifier, the replica amplifier configured to have a replica gain that is based on the bias voltage and the amplification control signal,
the gain-stabilization circuit configured to adjust at least one of the bias voltage or the amplification control signal based on a gain error associated with the replica amplifier.

Aspect 2: The apparatus of aspect 1, wherein the gain-stabilization circuit is configured to substantially stabilize the gain of the amplifier and the replica gain of the replica amplifier based on the adjustment of at least one of the bias voltage or the amplification control signal.

Aspect 3: The apparatus of aspect 2, wherein the gain-stabilization circuit is configured to substantially stabilize the gain of the amplifier and the replica gain of the replica amplifier to remain within a percentage threshold across a temperature range.

Aspect 4: The apparatus of aspect 2 or 3, wherein:
the amplifier is coupled to a supply voltage node;
the replica amplifier is coupled to the supply voltage node; and
the gain-stabilization circuit is configured to substantially stabilize the gain of the amplifier and the replica gain of the replica amplifier to remain within a percentage threshold across a range associated with a supply voltage provided at the supply voltage node.

Aspect 5: The apparatus of any previous aspect, wherein:
the amplifier is configured to amplify an input signal;
a transconductance of the amplifier is based on the bias voltage; and
the gain of the amplifier and the replica gain of the replica amplifier are proportional to the transconductance.

Aspect 6: The apparatus of any previous aspect, wherein:
the amplifier is configured to amplify another input signal;
a pulsewidth of the amplification control signal controls a duration that the amplifier amplifiers the other input signal; and
the gain of the amplifier and the replica gain of the replica amplifier are proportional to the pulsewidth of the amplification control signal.

Aspect 7: The apparatus of any previous aspect, wherein the gain-stabilization circuit is configured to:
provide a calibration input voltage to the replica amplifier;
amplify the calibration input voltage using the replica amplifier to generate a calibration output voltage; and
determine the gain error based on the calibration input voltage and the calibration output voltage.

Aspect 8: The apparatus of any previous aspect, wherein the gain-stabilization circuit is configured to:
increase a pulsewidth of the amplification control signal responsive to the gain error indicating that the replica gain of the replica amplifier is lower than a target gain; or
decrease the pulsewidth of the amplification control signal responsive to the gain error indicating that the replica gain of the replica amplifier is higher than the target gain.

Aspect 9: The apparatus of any previous aspect, wherein the gain-stabilization circuit is configured to:
adjust the bias voltage to increase a bias current responsive to the gain error indicating that the replica gain of the replica amplifier is lower than a target gain; or
adjust the bias voltage to decrease the bias current responsive to the gain error indicating that the replica gain of the replica amplifier is higher than the target gain.

Aspect 10: The apparatus of any previous aspect, wherein the gain-stabilization circuit comprises:
at least one of a bias voltage generator or an amplification control signal generator;
an input voltage generator coupled to an input of the replica amplifier; and
a gain-error correction circuit coupled to the input of the replica amplifier and an output of the replica amplifier, the gain-error correction circuit configured to provide at least one output to at least one of the bias voltage generator or the amplification control signal generator.

Aspect 11: The apparatus of aspect 10, wherein the gain-error correction circuit comprises:
at least one scaler coupled to an input of the gain-error correction circuit;
at least one combiner coupled to an output of the at least one scaler; and
at least one integrator coupled to an output of the at least one combiner.

Aspect 12: The apparatus of any previous aspect, wherein the gain-stabilization circuit comprises:
at least one switched-capacitor digital-to-analog converter coupled to an input of the replica amplifier; and
at least one other switched-capacitive digital-to-analog converter coupled to an output of the replica amplifier.

Aspect 13: The apparatus of aspect any previous aspect, wherein the gain-stabilization circuit is configured to compensate for at least one of a voltage offset or a flicker noise associated with the replica amplifier.

Aspect 14: The apparatus of any previous aspect, further comprising:
a pipeline analog-to-digital converter comprising:
at least two stages; and
at least one amplification circuit coupled between the at least two stages, the at least one amplification circuit comprising:
the amplifier; and
the gain-stabilization circuit.

Aspect 15: The apparatus of any previous aspect, wherein the amplifier and the replica amplifier each comprise:
at least one input transistor configured to accept an input voltage at a gate terminal of the at least one input transistor;
at least one transistor configured to be biased by the amplification control signal, the at least one transistor coupled to a drain terminal of the at least one input transistor;
at least one other transistor coupled between a supply voltage and the at least one transistor, the at least one other transistor configured to be biased by a reset signal; and
at least one current source coupled to a source terminal of the at least one input transistor, the at least one current source configured to generate a current based on the bias voltage.

Aspect 16: The apparatus of any previous aspect, wherein an architecture of the replica amplifier is identical to an architecture of the amplifier.

Aspect 17: The apparatus of any previous aspect, wherein the replica amplifier represents a scaled version of the amplifier.

Aspect 18: An apparatus comprising:
amplification means for providing a gain that is based on a bias voltage and an amplification control signal; and
gain-stabilization means for substantially stabilizing the gain of the amplification means, the gain-stabilization means comprising:
replication means for providing a replica gain that is based on the bias voltage and the amplification control signal; and
means for adjusting at least one of the bias voltage or the amplification control signal based on a gain error associated with the replication means.

Aspect 19: The apparatus of aspect 18, wherein:
the means for adjusting is configured to:
provide a calibration input voltage to the replication means; and
determine the gain error based on the calibration input voltage and a calibration output voltage; and
the replication means is configured to amplify the calibration input voltage to generate the calibration output voltage.

Aspect 20: The apparatus of aspect 18 or 19, wherein the gain-stabilization means comprises means for compensating for at least one of a voltage offset or a flicker noise associated with the replication means.

Aspect 21: A method for gain stabilization, the method comprising:
amplifying an input signal using an amplifier having a gain based on a bias voltage and an amplification control signal;
amplifying a calibration input voltage using a replica amplifier having a replica gain that is based on the bias voltage and the amplification control signal; and
adjusting at least one of the bias voltage or the amplification control signal based on a gain error associated with the replica amplifier.

Aspect 22: The method of aspect 21, further comprising:
generating, using the replica amplifier, a calibration output voltage based on the calibration input voltage; and
determining the gain error based on the calibration input voltage and the calibration output voltage.

Aspect 23: The method of aspect 22, wherein the adjusting comprises:
adjusting the bias voltage to increase a bias current responsive to the gain error indicating that the replica gain of the replica amplifier is lower than a target gain; or
adjusting the bias voltage to decrease the bias current responsive to the gain error indicating that the replica gain of the replica amplifier is higher than the target gain.

Aspect 24: The method of aspect 22 or 23, wherein the adjusting comprises:
increasing a pulsewidth of the amplification control signal responsive to the gain error indicating that the replica gain of the replica amplifier is lower than a target gain; or
decreasing the pulsewidth of the amplification control signal responsive to the gain error indicating that the replica gain of the replica amplifier is higher than the target gain.

Aspect 25: An apparatus comprising:
an amplifier having a gain that is based on a bias voltage and an amplification control signal; and
a gain-stabilization circuit coupled to the amplifier and comprising:
a gain-error correction circuit; and
switching circuitry configured to selectively:
provide an input voltage to an input of the amplifier; or
provide a calibration input voltage to the input of the amplifier and connect an output of the amplifier to the gain-error correction circuit,
the gain-error correction circuit configured to determine a gain error associated with the amplifier based on the switching circuitry connecting the output of the amplifier to the gain-error correction circuit,
the gain-stabilization circuit configured to adjust at least one of the bias voltage or the amplification control signal based on the gain error.

Aspect 26: The apparatus of aspect 25, wherein the switching circuitry comprises:
a first multiplexer coupled to the input of the amplifier; and
a second multiplexer coupled to the output of the amplifier.

Aspect 27: The apparatus of aspect 25, wherein:
the amplifier comprises:
a first amplification branch having an output coupled to another circuit; and
a second amplification branch having an output coupled to the gain-error correction circuit; and
the switching circuitry comprises at least one multiplexer coupled to the input of the amplifier and configured to selectively pass the input voltage or the calibration input voltage to the input of the amplifier.

Aspect 28: The apparatus of any of aspects 25-27, wherein the gain-stabilization circuit is configured to substantially stabilize the gain of the amplifier based on the adjustment of at least one of the bias voltage or the amplification control signal.

Aspect 29: The apparatus of any of aspects 25-28, further comprising:
a pipeline analog-to-digital converter comprising:
at least two stages; and
at least one amplification circuit coupled between the at least two stages, the at least one amplification circuit comprising:
the amplifier; and
the gain-stabilization circuit.

Aspect 30: The apparatus of aspect 29, wherein:
the amplifier is configured to amplify the input voltage during a first time period and amplify the calibration input voltage during a second time period; and
the input voltage is associated with a residue signal generated by one of the at least two stages of the pipeline analog-to-digital converter.

Aspect 31: A method for gain stabilization, the method comprising:
providing an input signal to an input of an amplifier;
amplifying the input signal using the amplifier having a gain based on a bias voltage and an amplification control signal;
providing a calibration input voltage to the input of the amplifier;
amplifying the calibration input voltage using the amplifier; and
adjusting at least one of the bias voltage or the amplification control signal based on a gain error associated with the amplifier.

What is claimed is:
1. An apparatus comprising:
a pipeline analog-to-digital converter comprising:
at least two stages; and
at least one amplification circuit coupled between the at least two stages, the at least one amplification circuit comprising:
an amplifier having a gain that is based on a bias voltage and an amplification control signal; and
a gain-stabilization circuit coupled to the amplifier, the gain-stabilization circuit comprising:
a replica amplifier corresponding to the amplifier, the replica amplifier configured to have a replica gain that is based on the bias voltage and the amplification control signal,
the gain-stabilization circuit configured to adjust at least one of the bias voltage or the amplification control signal based on a difference between an input voltage and an output voltage of the replica amplifier.

2. The apparatus of claim 1, wherein the gain-stabilization circuit is configured to substantially stabilize the gain of the amplifier and the replica gain of the replica amplifier based on the adjustment of at least one of the bias voltage or the amplification control signal.

3. The apparatus of claim 2, wherein the gain-stabilization circuit is configured to substantially stabilize the gain of the amplifier and the replica gain of the replica amplifier to remain within a percentage threshold across a temperature range.

4. The apparatus of claim 2, wherein:
the amplifier is coupled to a supply voltage node;
the replica amplifier is coupled to the supply voltage node; and
the gain-stabilization circuit is configured to substantially stabilize the gain of the amplifier and the replica gain of the replica amplifier to remain within a percentage threshold across a range associated with a supply voltage provided at the supply voltage node.

5. The apparatus of claim 1, wherein:
the amplifier is configured to amplify an input signal;
a transconductance of the amplifier is based on the bias voltage; and
the gain of the amplifier and the replica gain of the replica amplifier are proportional to the transconductance.

6. The apparatus of claim 1, wherein:
the amplifier is configured to amplify an input signal;
a pulsewidth of the amplification control signal controls a duration that the amplifier amplifies the input signal; and
the gain of the amplifier and the replica gain of the replica amplifier are proportional to the pulsewidth of the amplification control signal.

7. The apparatus of claim 1, wherein the gain-stabilization circuit is configured to:
provide a calibration input voltage to the replica amplifier;
amplify the calibration input voltage using the replica amplifier to generate a calibration output voltage; and
determine the difference between the input voltage and the output voltage of the replica amplifier based on the calibration input voltage and the calibration output voltage.

8. The apparatus of claim 1, wherein the gain-stabilization circuit is configured to:
increase a pulsewidth of the amplification control signal responsive to the difference between the input voltage and the output voltage of the replica amplifier indicating that the replica gain of the replica amplifier is lower than a target gain; or
decrease the pulsewidth of the amplification control signal responsive to the difference between the input voltage and the output voltage of the replica amplifier indicating that the replica gain of the replica amplifier is higher than the target gain.

9. The apparatus of claim 1, wherein the gain-stabilization circuit is configured to:
adjust the bias voltage to increase a bias current responsive to the difference between the input voltage and the output voltage of the replica amplifier indicating that the replica gain of the replica amplifier is lower than a target gain; or
adjust the bias voltage to decrease a bias current responsive to the difference between the input voltage and the output voltage of the replica amplifier indicating that the replica gain of the replica amplifier is higher than the target gain.

10. The apparatus of claim 1, wherein the gain-stabilization circuit comprises:

at least one of a bias voltage generator or an amplification control signal generator;
an input voltage generator coupled to an input of the replica amplifier; and
a gain-error correction circuit coupled to the input of the replica amplifier and an output of the replica amplifier, the gain-error correction circuit configured to provide at least one output to at least one of the bias voltage generator or the amplification control signal generator.

11. The apparatus of claim 10, wherein the gain-error correction circuit comprises:
at least one scaler coupled to an input of the gain-error correction circuit;
at least one combiner coupled to an output of the at least one scaler; and
at least one integrator coupled to an output of the at least one combiner.

12. The apparatus of claim 1, wherein the gain-stabilization circuit comprises:
at least one switched-capacitor digital-to-analog converter coupled to an input of the replica amplifier; and
at least one other switched-capacitive digital-to-analog converter coupled to an output of the replica amplifier.

13. The apparatus of claim 1, wherein the gain-stabilization circuit is configured to compensate for at least one of a voltage offset or a flicker noise associated with the replica amplifier.

14. The apparatus of claim 1, wherein the amplifier and the replica amplifier each comprise:
at least one input transistor configured to accept the input voltage at a gate terminal of the at least one input transistor;
at least one transistor configured to be biased by the amplification control signal, the at least one transistor coupled to a drain terminal of the at least one input transistor;
at least one other transistor coupled between a supply voltage and the at least one transistor, the at least one other transistor configured to be biased by a reset signal; and
at least one current source coupled to a source terminal of the at least one input transistor, the at least one current source configured to generate a current based on the bias voltage.

15. The apparatus of claim 1, wherein an architecture of the replica amplifier is identical to an architecture of the amplifier.

16. The apparatus of claim 1, wherein the replica amplifier represents a scaled version of the amplifier.

17. An apparatus comprising:
a pipeline analog-to-digital converter comprising:
at least two stages; and
at least one amplification circuit coupled between the at least two stages, the at least one amplification circuit comprising:
amplification means for providing a gain that is based on a bias voltage and an amplification control signal; and
gain-stabilization means for substantially stabilizing the gain of the amplification means, the gain-stabilization means comprising:
replication means for providing a replica gain that is based on the bias voltage and the amplification control signal; and
means for adjusting at least one of the bias voltage or the amplification control signal based on a difference between an input voltage and an output voltage of the replication means.

18. The apparatus of claim 17, wherein:
the means for adjusting is configured to:
provide a calibration input voltage to the replication means; and
determine the difference between the input voltage and the output voltage of the replication means based on the calibration input voltage and a calibration output voltage; and
the replication means is configured to amplify the calibration input voltage to generate the calibration output voltage.

19. The apparatus of claim 17, wherein the gain-stabilization means comprises means for compensating for at least one of a voltage offset or a flicker noise associated with the replication means.

20. A method for gain stabilization within at least one amplification circuit of a pipeline analog-to-digital converter, the at least one amplification circuit coupled between at least two stages of the pipeline analog-to-digital converter, the method comprising:
amplifying an input signal using an amplifier of the at least one amplification circuit having a gain based on a bias voltage and an amplification control signal;
amplifying a calibration input voltage using a replica amplifier of the at least one amplification circuit having a replica gain that is based on the bias voltage and the amplification control signal; and
adjusting at least one of the bias voltage or the amplification control signal based on a difference between an input voltage and an output voltage of the replica amplifier.

21. The method of claim 20, further comprising:
generating, using the replica amplifier, a calibration output voltage based on the calibration input voltage; and
determining the difference between the input voltage and the output voltage of the replica amplifier based on the calibration input voltage and the calibration output voltage.

22. The method of claim 20, wherein the adjusting comprises:
adjusting the bias voltage to increase a bias current responsive to the difference between the input voltage and the output voltage of the replica amplifier indicating that the replica gain of the replica amplifier is lower than a target gain; or
adjusting the bias voltage to decrease the bias current responsive to the difference between the input voltage and the output voltage of the replica amplifier indicating that the replica gain of the replica amplifier is higher than the target gain.

23. The method of claim 20, wherein the adjusting comprises:
increasing a pulsewidth of the amplification control signal responsive to the difference between the input voltage and the output voltage of the replica amplifier indicating that the replica gain of the replica amplifier is lower than a target gain; or
decreasing the pulsewidth of the amplification control signal responsive to the difference between the input voltage and the output voltage of the replica amplifier indicating that the replica gain of the replica amplifier is higher than the target gain.

24. The method of claim 20, wherein the input signal comprises a residue signal generated by one of the two stages of the pipeline analog-to-digital converter.

25. An apparatus comprising:
an amplifier having a gain that is based on a bias voltage and an amplification control signal; and
a gain-stabilization circuit coupled to the amplifier and comprising:
a gain-error correction circuit; and
switching circuitry configured to selectively:
provide an input signal to an input of the amplifier; or
provide a calibration input voltage to the input of the amplifier and connect an output of the amplifier to the gain-error correction circuit,
the gain-error correction circuit configured to determine a gain error associated with the amplifier based on the switching circuitry connecting the output of the amplifier to the gain-error correction circuit, the gain error representing a difference between the calibration input voltage and an output voltage of the amplifier,
the gain-stabilization circuit configured to adjust at least one of the bias voltage or the amplification control signal based on the gain error.

26. The apparatus of claim 25, wherein the switching circuitry comprises:
a first multiplexer coupled to the input of the amplifier; and
a second multiplexer coupled to the output of the amplifier.

27. The apparatus of claim 25, wherein:
the amplifier comprises:
a first amplification branch having an output coupled to another circuit; and
a second amplification branch having an output coupled to the gain-error correction circuit; and
the switching circuitry comprises at least one multiplexer coupled to the input of the amplifier and configured to selectively pass the input signal or the calibration input voltage to the input of the amplifier.

28. The apparatus of claim 25, wherein the gain-stabilization circuit is configured to substantially stabilize the gain of the amplifier based on the adjustment of at least one of the bias voltage or the amplification control signal.

29. The apparatus of claim 25, further comprising:
a pipeline analog-to-digital converter comprising:
at least two stages; and
at least one amplification circuit coupled between the at least two stages,
the at least one amplification circuit comprising:
the amplifier; and
the gain-stabilization circuit.

30. The apparatus of claim 29, wherein:
the amplifier is configured to amplify the input signal during a first time period and amplify the calibration input voltage during a second time period; and
the input signal is associated with a residue signal generated by one of the at least two stages of the pipeline analog-to-digital converter.

* * * * *